US009000302B2

(12) United States Patent
Shimizu et al.

(10) Patent No.: US 9,000,302 B2
(45) Date of Patent: Apr. 7, 2015

(54) WIRING BOARD

(71) Applicant: Shinko Electric Industries Co., Ltd., Nagano (JP)

(72) Inventors: Noriyoshi Shimizu, Nagano (JP); Hitoshi Sakaguchi, Nagano (JP); Wataru Kaneda, Nagano (JP); Masato Tanaka, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 14/247,355

(22) Filed: Apr. 8, 2014

(65) Prior Publication Data

US 2014/0311771 A1 Oct. 23, 2014

(30) Foreign Application Priority Data

Apr. 17, 2013 (JP) ................. 2013-086953
Nov. 19, 2013 (JP) ................. 2013-239119
Dec. 17, 2013 (JP) ................. 2013-260033

(51) Int. Cl.
*H05K 1/00* (2006.01)
*H05K 1/02* (2006.01)

(52) U.S. Cl.
CPC ...... *H05K 1/0298* (2013.01); *H05K 2201/0195* (2013.01)

(58) Field of Classification Search
CPC ........... H05K 1/00; H05K 3/427; H01L 21/00
USPC .................. 174/251; 361/792, 793
See application file for complete search history.

(56) References Cited

U.S. PATENT DOCUMENTS

| 7,224,046 | B2 | 5/2007 | Abe et al. | |
| 7,286,367 | B2 * | 10/2007 | Miyake et al. | ................ 361/765 |
| 7,339,118 | B1 | 3/2008 | Takada et al. | |
| 7,612,295 | B2 | 11/2009 | Takada et al. | |
| 8,021,748 | B2 * | 9/2011 | Asai et al. | ...................... 428/323 |
| 2006/0170046 | A1 * | 8/2006 | Hara | ............................. 257/347 |
| 2009/0229868 | A1 * | 9/2009 | Tsukada et al. | ............... 174/258 |

FOREIGN PATENT DOCUMENTS

| JP | H08-307057 | 11/1996 |
| JP | H11-054928 | 2/1999 |
| JP | H11-074651 | 3/1999 |
| JP | 11-126978 | 5/1999 |
| JP | 2003-243825 | 8/2003 |
| JP | 2004-087623 | 3/2004 |
| WO | WO2004/064467 | 5/2006 |

OTHER PUBLICATIONS

Office Action dated Jul. 8, 2014 issued with respect to the basic Japanese Patent Application No. 2014-114991.

* cited by examiner

*Primary Examiner* — Timothy Thompson
*Assistant Examiner* — Krystal Robinson
(74) *Attorney, Agent, or Firm* — IPUSA, PLLC

(57) ABSTRACT

A wiring board includes first insulating layers and second insulating layers formed on a core layer in this order; a third insulating layer and a solder resist layer formed on another surface of the core layer in this order, first wiring layers and second wiring layers formed in the first insulating layers and the second insulating layers, respectively, wherein a first end surface of the first via wiring exposes from the first surface of the outermost first insulating layer to be directly connected with an outermost second wiring layer, the first via wiring and the outermost second wiring layer being separately formed, the first surface of the outermost first insulating layer and the first end surface of the first via wiring are polished surfaces, smooth surfaces and are flush with each other, and the wiring density of the second wiring layers is higher than that of the first wiring layers.

10 Claims, 21 Drawing Sheets

WIRING BOARD

CROSS-REFERENCE TO RELATED APPLICATION

The present application is based on and claims the benefit of priority of Japanese Priority Application No. 2013-086953 filed on Apr. 17, 2013, Japanese Priority Application No. 2013-239119 filed on Nov. 19, 2013 and Japanese Priority Application No. 2013-260033 filed on Dec. 17, 2013, the entire contents of which are hereby incorporated by reference.

BACKGROUND OF THE INVENTION

1. Field of the Invention

The present invention relates to a wiring board.

2. Description of the Related Art

Conventionally, a technique is known to provide a high density wiring layer in a wiring board with a built-in passive component. Specifically, a wiring board is known in which a high wiring density layer including stacked insulating layers of photosensitive resin is formed on a low wiring density layer including stacked insulating layers of thermosetting resin. In such a case, a passive component is built-in the low wiring density layer.

It is described that the wiring layer can be made high density by embedding a wiring layer at a surface of a core board in an insulating layer (thermosetting resin) at the surface of the core board, in the low wiring density layer, and forming the high wiring density layer on the low wiring density layer in the above described wiring layer (see Patent Document 1, for example).

However, as the above described wiring board has an asymmetry structure in an up and down direction, there is a problem in that a warp is generated in the wiring board. The warp generated in the wiring board may be a problem when mounting an electronic component on the high wiring density layer.

Further, according to the above method described in Patent Document 1, a fine wiring cannot be formed in the insulating layer (thermosetting resin) at the surface of the core board and the fine wiring needs to be formed on an insulating layer of photosensitive resin formed on the insulating layer (thermosetting resin) at the core board.

In other words, as the fine wiring cannot be directly formed in the insulating layer (thermosetting resin) just by embedding the wiring layer at the surface of the core board in the insulating layer (thermosetting resin), the wiring layer cannot be made at a sufficiently high density.

PATENT DOCUMENT

[Patent Document 1] Japanese Laid-open Patent Publication No. 11-126978

SUMMARY OF THE INVENTION

The present invention is made in light of the above problems, and provides a wiring board or the like capable of suppressing generation of a warp while actualizing high density of a wiring layer.

According to an embodiment, there is provided a wiring board including: a core layer; a plurality of first insulating layers formed on a first surface of the core layer; a plurality of second insulating layers formed on a first surface of an outermost first insulating layer of the plurality of first insulating layers; a third insulating layer formed on a second surface of the core layer, the second surface being opposite to the first surface of the core layer; a solder resist layer formed on the third insulating layer, a plurality of first wiring layers formed in the plurality of first insulating layers, the plurality of first wiring layers including a first via wiring embedded in the outermost first insulating layer; and a plurality of second wiring layers formed in the plurality of second insulating layers, wherein each of the plurality of first insulating layers, and the third insulating layer are composed of a thermosetting insulating resin, respectively, wherein each of the plurality of second insulating layer, and the solder resist layer are composed of a photosensitive resin, respectively, wherein a first end surface of the first via wiring exposes from the first surface of the outermost first insulating layer to be directly connected with an outermost second wiring layer of the plurality of second wiring layers, the outermost second wiring layer facing the first surface of the outermost first insulating layer, the first end surface of the first via wiring and the outermost second wiring layer being separately formed, wherein the first surface of the outermost first insulating layer and the first end surface of the first via wiring are polished surfaces and smooth surfaces, respectively, wherein the first end surface of the first via wiring and the first surface of the outermost first insulating layer are flush with each other, and wherein the wiring density of the plurality of second wiring layers is higher than the wiring density of the plurality of first wiring layers.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
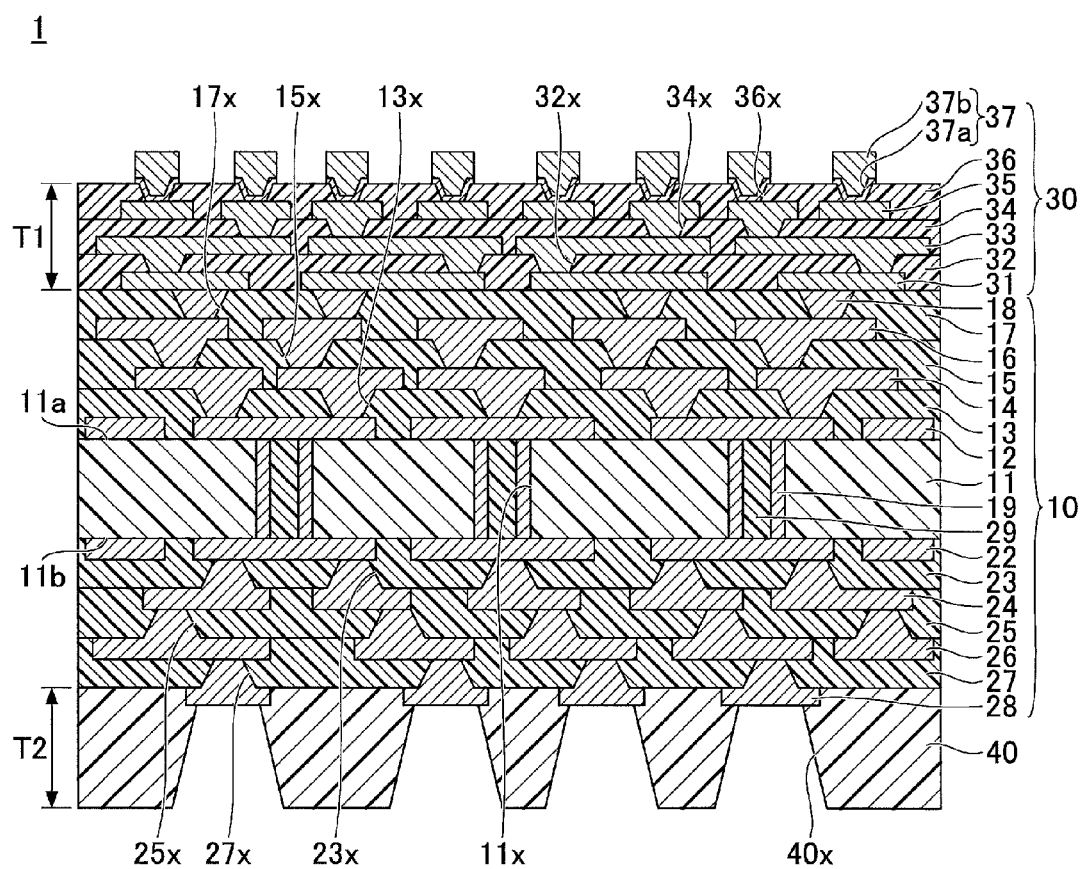
FIG. 1 is a cross-sectional view illustrating an example of a wiring board of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Wiring Board of First Embodiment

First, a structure of a wiring board of a first embodiment is explained. FIG. 1 is a cross-sectional view illustrating an example of a wiring board 1 of the first embodiment.

The wiring board 1 of the first embodiment includes a first wiring component 10, a second wiring component 30 that is formed on a first side of the first wiring component 10 and a solder resist layer 40 that is formed on a second side, which is opposite to the first side, of the first wiring component 10. The wiring board 1 may have a square shape of 40 mm×40 mm in a plane view, for example. However, the shape of the wiring board 1 in a plane view is not so limited, and the wiring board 1 may have any shape in a plane view.

The first wiring component 10, the second wiring component 30 and the solder resist layer 40 are explained in detail. In the following explanation, an upper side in FIG. 1 (at a wiring layer 37 side in the second wiring component 30) is referred to as a first side or a first surface. On the other hand, a lower side in FIG. 1 (at a solder resist layer 40 side) is referred to as a second side or a second surface.

First, the first wiring component 10 is explained. The first wiring component 10 is a low wiring density layer in which a wiring layer whose wiring density is lower than that of the second wiring component 30 is formed.

The first wiring component 10 includes a core layer 11 at a substantially center portion. For the core layer 11, for example, a so-called glass epoxy board in which thermosetting insulating resin such as epoxy-based resin or the like is impregnated in a glass cloth may be used. Alternatively, for the core layer 11, a board or the like in which thermosetting insulating resin such as epoxy-based resin or the like is impregnated in a woven fabric or a nonwoven fabric such as glass fiber, carbon fiber, aramid fiber or the like may be used. The thickness of the core layer 11 may be, for example, about 200 to 1000 μm. Here, the glass cloth or the like is omitted in the drawings.

The core layer 11 is provided with a plurality of through holes 11x. Each of the through holes 11x may have a circular shape with a diameter of about 100 to 500 μm in a plane view, for example. The pitch of the through holes 11x may be about 200 to 1000 μm, for example. A through wiring 19 is formed at an inner wall surface of each of the through holes 11x and a resin portion 29 is filled in the center portion (inside the through wiring 19) of the respective through hole 11x. The material of the through wiring 19 may be copper (Cu) or the like, for example. The material of the resin portion 29 may be insulating resin such as epoxy-based resin or the like, for example.

A wiring layer 12, an insulating layer 13, a wiring layer 14, an insulating layer 15, a wiring layer 16, an insulating layer 17 and a wiring layer 18 are formed at a first surface 11a of the core layer 11 in this order. The insulating layers 13, 15 and 17 are an example of a first insulating layer. Further, the insulating layer 17 is an example of an outermost first insulating layer. The wiring layers 14, 16 and 18 are an example of a first wiring layer. Further, the wiring layer is an example of a first via wiring.

The wiring layer 12 is a wiring pattern formed at the first surface 11a of the core layer 11. As will be explained below, a wiring layer 22 is formed at a second surface 11b of the core layer 11. The wiring layer 12 is electrically connected to the wiring layer 22 via the through wirings 19 that penetrate the core layer 11, respectively. The material of the wiring layer 12 may be copper (Cu) or the like, for example. The thickness of the wiring layer 12 may be about 10 to 20 μm, for example. The line and space (hereinafter, referred to as "line/space") of the wiring layer 12 may be about 20 μm/20 μm, for example.

The insulating layer 13 is formed at the first surface 11a of the core layer 11 such that to cover the wiring layer 12. The material of the insulating layer 13 may be thermosetting insulating resin that includes epoxy-based resin or the like as a main constituent, for example. The thickness of the insulating layer 13 may be about 20 to 45 μm, for example. The insulating layer 13 may include filler such as silica ($SiO_2$) or the like.

The wiring layer 14 is formed at a first side of the insulating layer 13 and is electrically connected to the wiring layer 12. The wiring layer 14 includes via wirings respectively filled in via holes 13x that are provided to penetrate the insulating layer 13 to expose a first surface of the wiring layer 12, and a wiring pattern formed at the first surface of the insulating layer 13. Each of the via holes 13x is a concave portion having an inverse cone trapezoid shape where the diameter of an open portion at the insulating layer 15 side is larger than the diameter of a bottom portion formed at an upper surface of the wiring layer 12. The diameter of the via hole 13x at the open portion may be about 60 to 70 µm, for example. The material of the wiring layer 14, and the thickness and the line/space of the wiring pattern that composes the wiring layer 14 may be the same as those of the wiring layer 12, for example.

The insulating layer 15 is formed at a first surface of the insulating layer 13 such that to cover the wiring layer 14. The material and the thickness of the insulating layer 15 may be the same as those of the insulating layer 13, for example. The insulating layer 15 may include filler such as silica ($SiO_2$) or the like.

The wiring layer 16 is formed at a first side of the insulating layer 15 and is electrically connected to the wiring layer 14. The wiring layer 16 includes via wirings respectively filled in via holes 15x that are provided to penetrate the insulating layer 15 to expose a first surface of the wiring layer 14, and a wiring pattern formed at the first surface of the insulating layer 15. Each of the via holes 15x is a concave portion having an inverse cone trapezoid shape where the diameter of an open portion at the insulating layer 17 side is larger than the diameter of a bottom portion formed at an upper surface of the wiring layer 14. The diameter of the via hole 15x at the open portion may be about 60 to 70 µm, for example. The material of the wiring layer 16, and the thickness and the line/space of the wiring pattern that composes the wiring layer 16 may be the same as those of the wiring layer 12, for example.

The insulating layer 17 is formed at a first surface of the insulating layer 15 such that to cover the wiring layer 16. An upper surface of the insulating layer 17 (on which an insulating layer 31 is formed) is a polished surface and is a smooth surface. The material and the thickness of the insulating layer 17 may be the same as those of the insulating layer 13, for example. The insulating layer 17 may include filler such as silica ($SiO_2$) or the like.

The wiring layer 18 includes via wirings respectively filled in via holes 17x that are provided to penetrate the insulating layer 17 to expose a first surface of the wiring layer 16. The wiring layer 18 is electrically connected to the wiring layer 16. Each of the via holes 17x is a concave portion having an inverse cone trapezoid shape where the diameter of an open portion at the second wiring component 30 side is larger than the diameter of a bottom portion formed at an upper surface of the wiring layer 16. The diameter of the via hole 17x at the open portion may be about 60 to 70 µm, for example. A first surface (a surface at the second wiring component 30 side) of the wiring layer 18, which is the via wirings, and a first surface (a surface at the second wiring component 30 side) of the insulating layer 17 may be flush with each other in height, for example. The first surface of the wiring layer 18 is directly connected to a wiring layer 31 of the second wiring component 30. The material of the wiring layer 18 may be the same as that of the wiring layer 12, for example. An upper surface of the wiring layer 18, which is a via wiring, (on which the insulating layer 31 is formed) is a polished surface and is a smooth surface.

The wiring layer 22, an insulating layer 23, a wiring layer 24, an insulating layer 25, a wiring layer 26, an insulating layer 27 and a wiring layer 28 are formed on the second surface 11b of the core layer 11. The insulating layers 23, 25 and 27 are an example of a third insulating layer.

The wiring layer 22 is formed at the second surface 11b of the core layer 11. The wiring layer 22 is electrically connected to the wiring layer 12 that is formed at the first surface 11a of the core layer 11 through the through wirings 19 that perpetrate the core layer 11. The material of the wiring layer 22, and the thickness and the line/space of the wiring pattern that composes the wiring layer 22 may be the same as those of the wiring layer 12, for example.

The insulating layer 23 is formed at the second surface 11b of the core layer 11 such that to cover the wiring layer 22. The material and the thickness of the insulating layer 23 may be the same as those of the insulating layer 13, for example. The insulating layer 23 may include filler such as silica ($SiO_2$) or the like.

The wiring layer 24 is formed at a second side of the insulating layer 23 and is electrically connected to the wiring layer 22. The wiring layer 24 includes via wirings respectively filled in via holes 23x that are provided to penetrate the insulating layer 23 to expose a second surface of the wiring layer 22, and a wiring pattern formed at the second surface of the insulating layer 23. Each of the via holes 23x is a concave portion having a cone trapezoid shape where the diameter of an open portion at the insulating layer 25 side is larger than the diameter of a bottom portion formed at a lower surface of the wiring layer 22. The diameter of the via hole 23x at the open portion may be about 60 to 70 µm, for example. The material of the wiring layer 24, and the thickness and the line/space of the wiring pattern that composes the wiring layer 24 may be the same as those of the wiring layer 12, for example.

The insulating layer 25 is formed at a second surface of the insulating layer 23 such that to cover the wiring layer 24. The material and the thickness of the insulating layer 25 may be the same as those of the insulating layer 13, for example. The insulating layer 25 may include filler such as silica ($SiO_2$) or the like.

The wiring layer 26 is formed at a second side of the insulating layer 25 and is electrically connected to the wiring layer 24. The wiring layer 26 includes via wirings respectively filled in via holes 25x that are provided to penetrate the insulating layer 25 to expose a second surface of the wiring layer 24, and a wiring pattern formed at the second surface of the insulating layer 25. Each of the via holes 25x is a concave portion having a cone trapezoid shape where the diameter of an open portion at the insulating layer 27 side is larger than the diameter of a bottom portion formed at a lower surface of the wiring layer 24. The diameter of the via hole 25x at the open portion may be about 60 to 70 µm, for example. The material of the wiring layer 26, and the thickness and the line/space of the wiring pattern that composes the wiring layer 26 may be the same as those of the wiring layer 12, for example.

The insulating layer 27 is formed at a second surface of the insulating layer 25 such that to cover the wiring layer 26. The material and the thickness of the insulating layer 27 may be the same as those of the insulating layer 13, for example. The insulating layer 27 may include filler such as silica ($SiO_2$) or the like.

The wiring layer 28 is formed at a second side of the insulating layer 27 and is electrically connected to the wiring layer 26. The wiring layer 28 includes via wirings respectively filled in via holes 27x that are provided to penetrate the insulating layer 27 to expose a second surface of the wiring layer 26, and a wiring pattern formed at the second surface of the insulating layer 27. Each of the via holes 27x is a concave portion having a cone trapezoid shape where the diameter of an open portion at the solder resist layer 40 side is larger than the diameter of a bottom portion formed at a lower surface of the wiring layer 26. The diameter of the via hole 27x at the open portion may be about 60 to 70 µm, for example. The material of the wiring layer 28, and the thickness and the line/space of the wiring pattern that composes the wiring layer 28 may be the same as those of the wiring layer 12, for example.

As such, the number of the insulating layers and the wiring layers formed on one side (first side) and the other side (second side) of the core layer 11 is the same in the first wiring component 10. In other words, the insulating layers and the wiring layers have a symmetric layer structure with respect to the core layer 11 as the center in an up and down direction. Thus, the first wiring component 10 has high durability against warp. In particular, by forming the insulating layers to have the same thickness, a balance in the up and down direction is improved so that the first wiring component 10 has high durability against warp.

In this embodiment, three insulating layers (insulating layers 13, 15 and 17) are formed at the first surface 11a of the core layer 11, and three insulating layers (insulating layers 23, 25 and 27) are formed at the second surface 11b of the core layer 11. However, the number of insulating layers that are formed at each surface of the core layer 11 is not limited to three. Further, in this embodiment, four wiring layers (wiring layers 12, 14, 16 and 18) are formed at the first surface 11a side of the core layer 11, and four wiring layers (wiring layers 22, 24, 26 and 28) are formed at the second surface 11b side of the core layer 11. However, the number of the wiring layers that are formed at each surface of the core layers 11 is not limited to four.

In this embodiment, the wiring layer 18 at the second wiring component 30 side includes only the via wirings respectively formed in the via holes 17x of the insulating layer 17. In other words, the wiring layer 18 does not include a wiring pattern that is formed at the first surface of the insulating layer 17 and is integrally formed with the via wirings. Although the wiring layer 18 and the wiring layer 31 are physically and electrically connected with each other, they are not integrally formed. In other words, the wiring layer 18 and the wiring layer 31 are separately (discontinuously) formed. Specifically, when the wiring layer 31 is formed by a semi-additive method as is explained in the following, a seed layer (a stacked layer structure or the like of a titanium (Ti) layer and a copper (Cu) layer or the like) exits at an interface between the first surface of the wiring layer 18 and the second surface of the wiring layer 31. The reason to adopt this structure is to form a high density wiring pattern (line/space is about 2 μm/2 μm, for example) as the wiring layer 31. This structure is explained in detail later when explaining a method of manufacturing the wiring board 1.

Next, the second wiring component 30 is explained. The second wiring component 30 is a high wiring density layer in which wiring layers each of whose wiring density is higher than that of each of the wiring layers of the first wiring component 10. The second wiring component 30 includes a wiring layer 31, an insulating layer 32, a wiring layer 33, an insulating layer 34, a wiring layer 35, an insulating layer 36 and a wiring layer 37 formed on the first wiring component 10 in this order. The wiring layers 31, 33 and 35 are an example of a second wiring layer. The insulating layers 32, 34 and 36 are an example of a second insulating layer.

The thickness $T_1$ of the second wiring component 30 (the thickness of a part including the insulating layers 32, 34 and 36, and the wiring layers 31, 33 and 35) may be about 20 to 40 μm, for example. Here, the "thickness of the second wiring component 30" in this embodiment indicates a part only including the insulating layers and does not include protruding portions of the wiring layer 37.

The wiring layer 31 is a wiring pattern formed at the first surface of the insulating layer 17 of the first wiring component 10. A part of a second surface of the wiring layer 31 is in contact with a first surface of the wiring layer 18 of the first wiring component 10 and the wiring layer 31 and the wiring layer 18 are electrically connected with each other. The material of the wiring layer 31 may be copper (Cu) or the like, for example. The thickness of the wiring layer 31 may be about 1 to 3 μm, for example. The line/space of the wiring layer 31 may be about 2 μm/2 μm, for example.

The insulating layer 32 is formed at the first surface of the insulating layer 17 of the first wiring component 10 such that to cover the wiring layer 31. The material of the insulating layer 32 may be, for example, photosensitive insulating resin that includes phenol-based resin, polyimide-based resin or the like as a main constituent. The thickness of the insulating layer 32 may be about 5 to 10 μm, for example. The insulating layer 32 may include filler such as silica ($SiO_2$) or the like.

The wiring layer 33 is formed at a first side of the insulating layer 32 and is electrically connected to the wiring layer 31. The wiring layer 33 includes via wirings respectively filled in via holes 32x that are provided to penetrate the insulating layer 32 to expose a first surface of the wiring layer 31, and a wiring pattern formed at the first surface of the insulating layer 32. Each of the via holes 32x is a concave portion having an inverse cone trapezoid shape where the diameter of an open portion at the insulating layer 34 side is larger than the diameter of a bottom portion formed at an upper surface of the wiring layer 31. The diameter of the via hole 32x at the open portion may be about 10 to 20 μm, for example. The material of the wiring layer 33, and the thickness and the line/space of the wiring pattern that composes the wiring layer 33 may be the same as those of the wiring layer 31, for example.

The insulating layer 34 is formed on a first surface of the insulating layer 32 such that to cover the wiring layer 33. The material and the thickness of the insulating layer 34 may be the same as those of the insulating layer 32, for example. The insulating layer 34 may include filler such as silica ($SiO_2$) or the like.

The wiring layer 35 is formed at a first side of the insulating layer 34. The wiring layer 35 includes via wirings respectively filled in via holes 34x that are provided to penetrate the insulating layer 34 to expose a first surface of the wiring layer 33, and a wiring pattern formed at a first surface of the insulating layer 34. Each of the via holes 34x is a concave portion having an inverse cone trapezoid shape where the diameter of an open portion at the insulating layer 36 side is larger than the diameter of a bottom portion formed at an upper surface of the wiring layer 33. The diameter of the via hole 34x at the open portion may be about 10 to 20 μm, for example. The material of the wiring layer 35, and the thickness and the line/space of the wiring pattern that composes the wiring layer 35 may be the same as those of the wiring layer 31, for example.

The insulating layer 36 is formed at a first surface of the insulating layer 34 such that to cover the wiring layer 35. The material and the thickness of the insulating layer 36 may be the same as those of the insulating layer 32, for example. The insulating layer 36 may include filler such as silica ($SiO_2$) or the like.

The wiring layer 37 is formed at a first side of the insulating layer 36. The wiring layer 37 includes via wirings respectively filled in via holes 36x that are provided to penetrate the insulating layer 36 to expose a first surface of the wiring layer 35, and pads protruded from the first surface of the insulating layer 36. Each of the via holes 36x is a concave portion having an inverse cone trapezoid shape where the diameter of an open portion at the pad side is larger than the diameter of a bottom portion formed at an upper surface of the wiring layer 35. The diameter of the via hole 15x at the open portion may be about 10 to 20 μm, for example.

Each of the pads (protruding portions) of the wiring layer 37 includes a seed layer 37a and an electrolytic plating layer 37b. The electrolytic plating layer 37b is covered by the seed layer 37a at its bottom surface (a surface at the insulating layer 36 side). In other words, the seed layer 37a is not formed at an upper surface and a side surface of the pad that composes the wiring layer 37. The seed layer 37a may be formed by stacking a titanium (Ti) layer and a copper (Cu) layer in this order, for example. The thickness of the titanium (Ti) layer may be about 20 to 50 nm, for example. The thickness of the copper (Cu) layer may be about 100 to 300 nm, for example. Titanium nitride (TiN) or the like may be used instead of titanium (Ti). The material of the electrolytic plating layer 37b may be copper (Cu) or the like, for example.

The thickness of the wiring layer 37 (the total thickness of the electrolytic plating layer 37b and the seed layer 37a including the respective pad portion that protrudes from the first surface of the insulating layer 36) may be about 10 μm, for example. Each of the pads of the wiring layer 37 may have a circular shape in a plane view, for example. At this time, the diameter of each of the pads of the wiring layer 37 may be larger than that of the open portion of the via hole 36x (about 10 to 20 μm, for example), and may be about 20 to 30 μm, for example. The pitch of the pads of the wiring layer 37 may be about 40 to 50 μm, for example. The pads of the wiring layer 37 function as pads to be electrically connected to an electronic component such as a semiconductor chip or the like for mounting the electronic component.

Here, a surface processing layer, not illustrated in the drawings, may be formed at a surface (at an upper surface and a side surface, or only at an upper surface) of the pads of the wiring layer 37. As an example of the surface processing layer, an Au layer, a Ni/Au layer (a metal layer including a Ni layer and an Au layer stacked in this order), a Ni/Pd/Au layer (a metal layer including a Ni layer, a Pd layer and an Au layer stacked in this order) or the like may be used. Further, the surface processing layer may be formed by performing an antioxidation process such as an Organic Solderability Preservative (OSP) process or the like to the surface (at the upper surface and the side surface, or only at the upper surface) of the pads of the wiring layer 37.

As will be described in an alternative example 1 of the first embodiment, by forming the surface processing layer, solder wettability can be improved when the pads of the wiring layer 37 and electrode terminals of a semiconductor chip are flip chip connected via solder bumps, for example. In particular, when the surface processing layer is formed only at the upper surface of the pads of the wiring layer 37, flow of the solder to the side surface of the pads of the wiring layer 37 can be prevented as only the surface processing layer can have good solder wettability to the solder bumps.

If the solder flows to the side surface of the each of the pads of the wiring layer 37, there is a possibility that the adjacent wiring layers 37 short by the solder. Thus, it is difficult to be connected with a semiconductor chip including electrode terminals with a fine and narrow pitch. However, when the surface processing layer is formed only at the upper surface of each of the pads of the wiring layer 37, the flow of the solder to the side surface of each of the pads of the wiring layer 37 can be prevented. Thus, this structure is appropriately connected with the semiconductor chip including the electrode terminals with a fine and narrow pitch.

Next, the solder resist layer 40 is explained. The solder resist layer 40 is an outermost insulating layer that is formed at a second surface of the insulating layer 27 of the first wiring component 10 such that to cover the wiring layer 28 of the first wiring component 10. The material of the solder resist layer 40 may be photosensitive insulating resin that includes phenol-based resin, polyimide-based resin or the like as a main constituent, for example. The solder resist layer 40 may include filler such as silica ($SiO_2$) or the like.

The solder resist layer 40 is provided with open portions 40x, and a part of the wiring layer 28 of the first wiring component 10 is exposed at a bottom portion of each of the open portions 40x. The wiring layer 28 that is exposed at the bottom portions of the open portions 40x, respectively, function as pads that are electrically connected to a mounting substrate such as a mother board or the like, for example. Here, a surface processing layer the same as the surface processing layer as described above may be formed at a lower surface of the wiring layer 28 that is exposed at the open portions 40x.

The thickness $T_2$ of the solder resist layer 40 is more than or equal to the thickness $T_1$ of the second wiring component 30 (about 20 to 40 μm, for example). For example, when the thickness $T_1$ of the second wiring component 30 is 30 μm, the thickness $T_2$ of the solder resist layer 40 may be about 30 to 50 μm, for example. As such, by setting the thickness $T_2$ of the solder resist layer 40 to be more than or equal to the thickness $T_1$ of the second wiring component 30 (by setting the thickness $T_1$ of the second wiring component 30 to be less than or equal to the thickness $T_2$ of the solder resist layer 40), the warped amount of the wiring board 1 can be reduced.

Specifically, a ratio $T_1/T_2$ of the thickness $T_1$ of the second wiring component 30 with respect to the thickness $T_2$ of the solder resist layer 40 may be less than or equal to 1. More preferably, the ratio $T_1/T_2$ may be less than or equal to 0.75. With this structure, the warped amount of the wiring board 1 can be further reduced. This advantage is explained later in detail with simulation results of warp.

The elastic coefficient (modulus of transverse elasticity) of the core layer 11 may be about 30 GPa and the coefficient of thermal expansion (linear coefficient of expansion) of the core layer 11 may be about 10 ppm/° C. in the wiring board 1. Further, the elastic coefficient of the insulating layers 13, 15, 17, 23, 25 and 27 including a thermosetting resin as a main constituent may be about 5 to 15 GPa and the coefficient of thermal expansion of the insulating layers 13, 15, 17, 23, 25 and 27 may be about 10 to 40 ppm/° C. Further, the elastic coefficient of the insulating layers 32, 34 and 36 including a photosensitive resin as a main constituent may be about 5 GPa and the coefficient of thermal expansion of the insulating layers 32, 34 and 36 may be about 50 to 70 ppm/° C. Further, the elastic coefficient of the solder resist layer 40 including a photosensitive resin as a main constituent may be about 2 to 4 GPa and the coefficient of thermal expansion of the solder resist layer 40 may be about 40 to 50 ppm/° C.

The coefficient of thermal expansion of each of the insulating layers may be adjusted to be a predetermined value by the amount of filler contained therein, for example. However, for the insulating layer including a photosensitive resin as a main constituent, as exposure becomes impossible when the amount of the filler becomes too large, there is a limitation (upper limitation) in the amount of the containable filler. Thus, the coefficient of thermal expansion of the insulating layer including a photosensitive resin as a main constituent tends to be larger than that of the insulating layer including a thermosetting resin as a main constituent. For the filler, in addition to silica ($SiO_2$) as described above, kaolin ($Al_2Si_2O_5(OH)_4$), talc ($Mg_3Si_4O_{10}(OH_2)$), alumina ($Al_2O_3$) or the like may be used, for example. Further, these may be mixed.

By setting physical properties (elastic coefficient and coefficient of thermal expansion) as such, the wiring board 1 has a structure such that it becomes softer from the core layer 11 as a center toward outer layers. Thus, by a synergy effect with the thickness relationship of the solder resist layer 40 and the second wiring component 30 as described above, warp of the wiring board 1 can be reduced.

(Method of Manufacturing Wiring Board of First Embodiment)

Next, a method of manufacturing the wiring board 1 of the first embodiment is explained. FIG. 2A to FIG. 9 are views illustrating a manufacturing step of the wiring board 1 of the first embodiment. Although an example of a manufacturing step in which a part corresponding to a plurality of wiring boards is firstly manufactured and then, the plurality of wiring boards are obtained by individualizing the part in this embodiment, a manufacturing step in which each single wiring board is manufactured may be alternatively used.

FIG. 2A to FIG. 4B illustrate a manufacturing step of the first wiring component 10. First, in a process illustrated in FIG. 2A, a base material including the core layer 11, a plate shaped metal foil 120 formed at the first surface 11a of the core layer 11, and a plate shaped metal foil 220 formed at the second surface 11b is prepared. Then, the plurality of through holes 11x are formed in the base material. For the core layer 11, for example, a so-called glass epoxy board or the like in which insulating resin such as epoxy-based resin or the like is impregnated in a glass cloth may be used.

Alternatively, a board or the like in which insulating resin such as epoxy-based resin or the like is impregnated in a woven fabric or a nonwoven fabric such as glass fiber, carbon fiber, aramid fiber or the like may be used for the core layer 11. The thickness of the core layer 11 may be about 200 to 1000 μm, for example. For the metal foils 120 and 220, copper foils or the like each having a thickness of about 10 to 20 μm may be used, for example. The through holes 11x may be formed by drilling or the like, for example. Each of the through holes 11x may have a circular shape whose diameter is about 100 to 500 μm in a plane view, for example. The pitch of the through holes 11x may be about 200 to 1000 μm, for example.

Figure 2A:
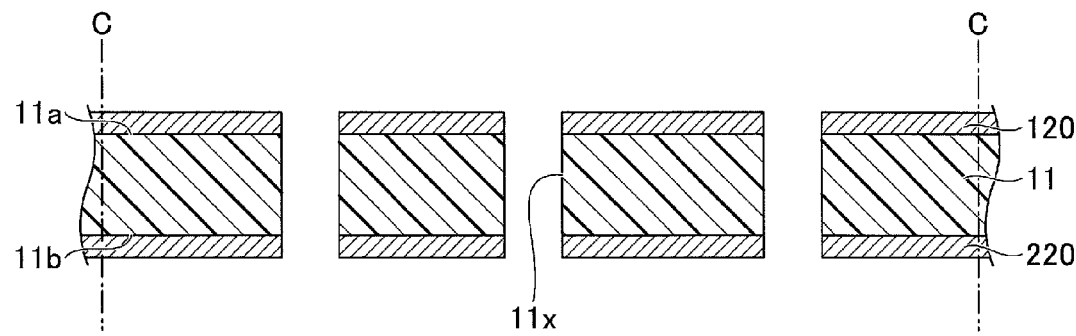
FIG. 2A to FIG. 2C are views illustrating an example of a manufacturing step of the wiring board of the first embodiment.
Figure 2B:
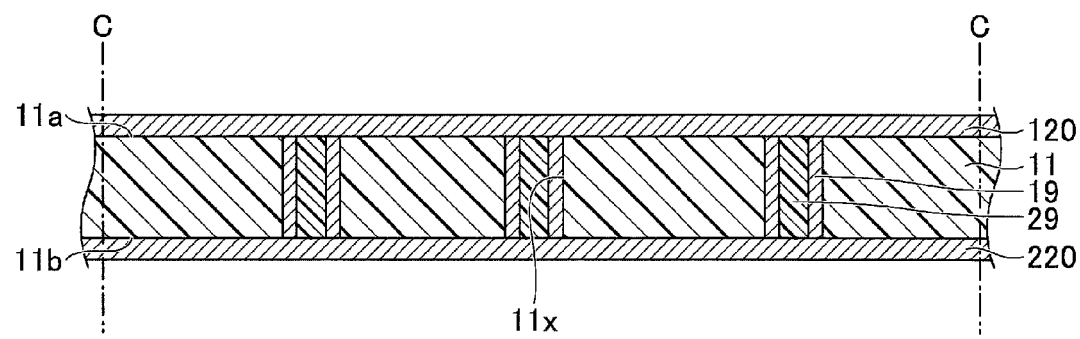

Next, in a process illustrated in FIG. 2B, the through wiring 19 is formed at an inner wall surface of each of the through holes 11x by electroless plating or the like using copper (Cu) or the like, for example. Then, the resin portion 29 is formed at the center portion of each of the through holes 11x, at the inner wall surface on which the through wiring 19 is formed, by filling insulating resin such as epoxy-based resin or the like, for example.

Thereafter, copper (Cu) patterns or the like are formed at an upper end surface and a lower end surface of each of the through wirings 19 and the resin portions 29 by electroless plating or the like, for example. Here, the copper (Cu) patterns or the like that are formed at the upper end surface and the lower end surface of each of the through wirings 19 and the resin portions 29 and the metal foils that are formed at the periphery of the copper (Cu) patterns are not distinguished. Thus, in FIG. 2B, the parts where the copper (Cu) patterns or the like are formed are also illustrated as the plate shaped metal foils 120 and 220 (the same in other drawings).

Figure 2C:
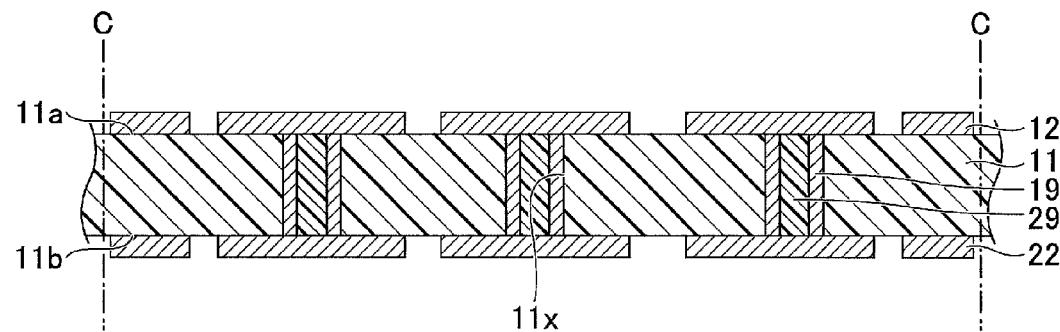

Next, in a process illustrated in FIG. 2C, the plate shaped metal foils 120 and 220 are patterned to form the wiring layer 12 at the first surface 11a and the wiring layer 22 at the second surface 11b, of the core layer 11. The wiring layers 12 and 22 may be formed by a subtractive method or the like, for example.

Figure 3A:
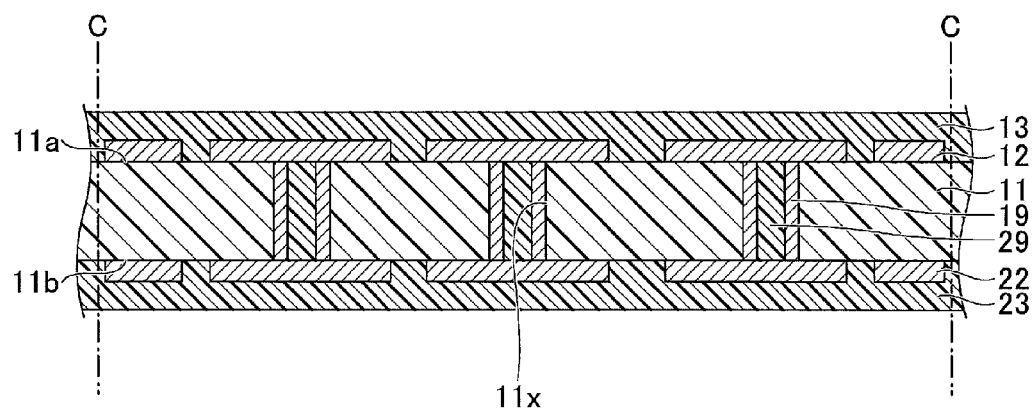
FIG. 3A to FIG. 3C are views illustrating an example of a manufacturing step of the wiring board of the first embodiment.

Next, in a process illustrated in FIG. 3A, the insulating layer 13 is formed at the first surface 11a of the core layer 11 such that to cover the wiring layer 12. Further, the insulating layer 23 is formed at the second surface 11b of the core layer 11 such that to cover the wiring layer 22. The material of the insulating layers 13 and 23 may be a thermosetting insulating resin including epoxy-based resin or the like as a main constituent, for example. The thickness of the insulating layers 13 and 23 may be about 20 to 45 μm, for example. The insulating layers 13 and 23 may include filler such as silica ($SiO_2$) or the like.

When the thermosetting insulating resin including an epoxy-based resin film or the like as a main constituent is used for the material of the insulating layers 13 and 23, the insulating resin film is laminated at the first surface 11a of the core layer 11 such that to cover the wiring layer 12. Further, the insulating resin film is laminated at the second surface 11b of the core layer 11 such that to cover the wiring layer 22. Then, the insulating layers 13 and 23 are formed by curing the insulating resin films by heating them to a temperature higher than or equal to the curing temperature while pressing the laminated insulating resin films. Here, by laminating the insulating resin films in vacuum atmosphere, generation of voids can be prevented.

When the thermosetting insulating resin including liquid or paste epoxy-based resin or the like as a main constituent is used for the material of the insulating layers 13 and 23, the liquid or paste insulating resin is coated at the first surface 11a of the core layer 11 by spin coating or the like such that to cover the wiring layer 12. Further, the liquid or paste insulating resin is coated at the second surface 11b of the core layer 11 by spin coating or the like such that to cover the wiring layer 22. Then, the insulating layers 13 and 23 are formed by curing the coated insulating resin by heating it to a temperature higher than or equal to the curing temperature.

Figure 3B:
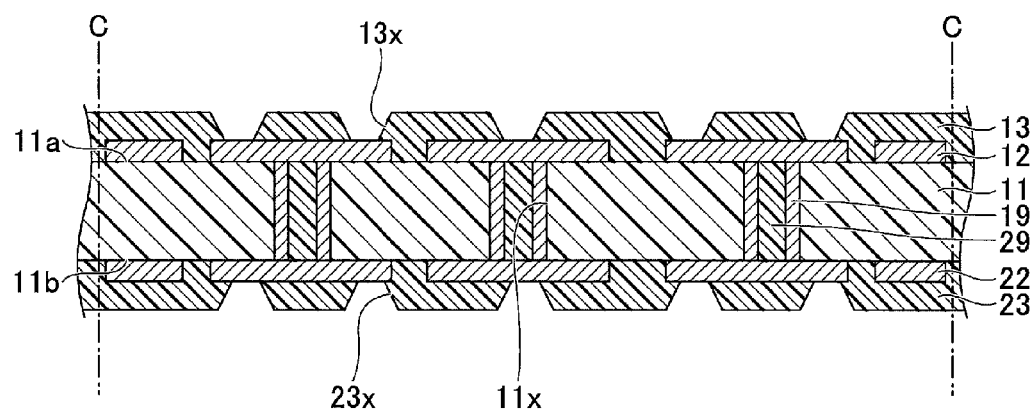

Next, in a process illustrated in FIG. 3B, the via holes 13x that penetrate the insulating layer 13 to expose the upper surface of the wiring layer 12 are formed at the insulating layer 13. Further, the via holes 23x that penetrate the insulating layer 23 to expose the lower surface of the wiring layer 22 are formed at the insulating layer 23. The via holes 13x and 23x may be formed by a laser processing or the like using $CO_2$ laser or the like, for example. When the via holes 13x and 23x are formed by laser processing, a desmear process may be performed to remove resin residue adhered at surfaces of the wiring layers 12 and 22 at the bottom portions of the via holes 13x and 23x, respectively.

Figure 3C:
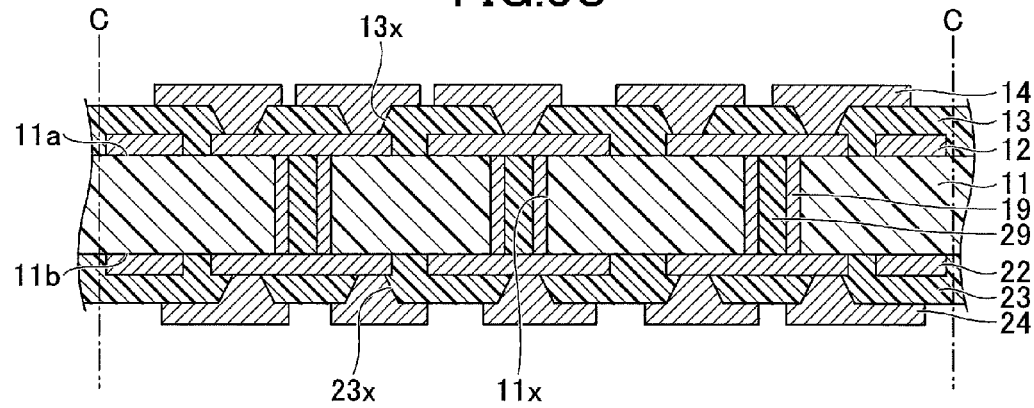

Next, in a process illustrated in FIG. 3C, the wiring layer 14 is formed at the first side of the insulating layer 13, and the wiring layer 24 is formed at the second side of the insulating layer 23. The wiring layer 14 includes the via wirings respectively filled in the via holes 13x that are provided to penetrate the insulating layer 13 to expose the first surface of the wiring layer 12, and the wiring pattern formed at the first surface of the insulating layer 13. The wiring layer 14 is electrically connected to the wiring layer 12 that is exposed at the bottom portion of each of the via holes 13x.

Further, the wiring layer 24 includes the via wirings respectively filled in via holes 23x that are provided to penetrate the insulating layer 23 to expose the second surface of the wiring layer 22, and the wiring pattern formed at the second surface of the insulating layer 23. The wiring layer 24 is electrically connected to the wiring layer 22 that is exposed at the bottom portion of each of the via holes 23x.

The material of the wiring layers 14 and 24 may be copper (Cu) or the like, for example. The wiring layers 14 and 24 may be formed by various methods of forming a wiring such as a semi-additive method, a subtractive method or the like. As an example, a method of forming the wiring layer 14 using the semi-additive method is explained in the following.

First, a seed layer (not illustrated in the drawings) of copper (Cu) or the like is formed on the insulating layer 13 including the upper surface of the wiring layer 12 that is exposed at the bottom portion of each of the via holes 13x and the inner wall surface of each of the via holes 13x by electroless plating or a sputtering method. Further, a resist layer (not illustrated in the drawings) is formed on the seed layer. The resist layer is provided with open portions corresponding to the wiring layer 14. Then, an electrolytic plating layer (not illustrated in the drawings) of copper (Cu) or the like is formed at the open portions of the resist layer by electroplating using the seed layer as a power supply layer.

Subsequently, after removing the resist layer, a part of the seed layer that is not covered by the electrolytic plating layer is removed by etching using the electrolytic plating layer as a mask. With this, the wiring layer 14 in which the electrolytic plating layer is stacked on the seed layer is formed. This means that the wiring layer 14 including the via wirings respectively filled in the via holes 13x, and the wiring pattern formed on the insulating layer 13, are formed on the insulating layer 13.

Here, at this time, each of the wiring layers 14 and 24 have a stacked structure of the seed layer and the electrolytic plating layer formed on the seed layer, the seed layer is not illustrated in the drawings.

Figure 4A:
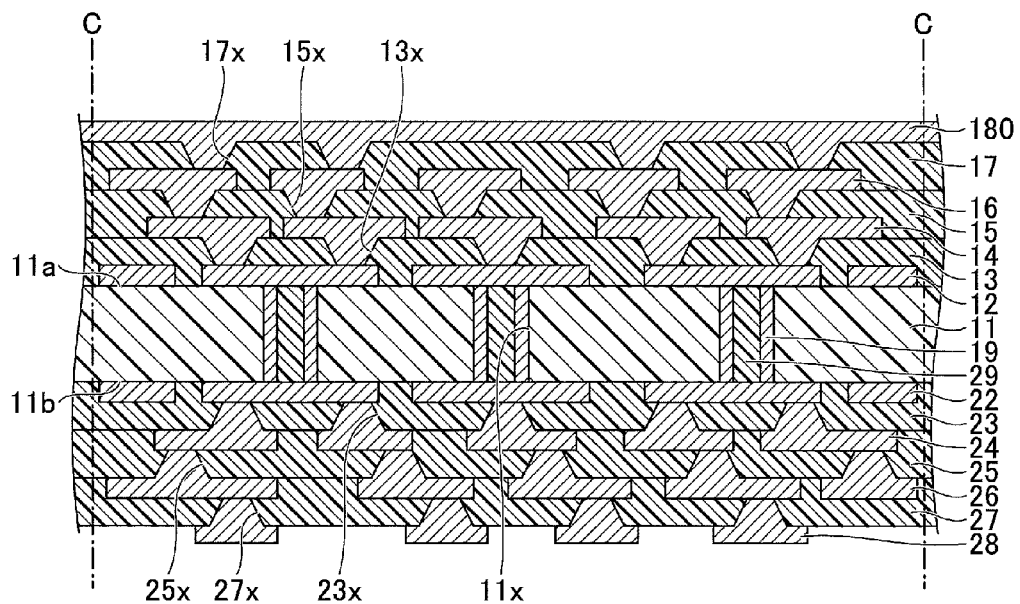
FIG. 4A and FIG. 4B are views illustrating an example of a manufacturing step of the wiring board of the first embodiment.

Next, in a process illustrated in FIG. 4A, by repeating the processes as explained above with reference to FIG. 3A to FIG. 3C, the insulating layer 15, the wiring layer 16, the insulating layer 17 and a metal layer 180 are formed on the insulating layer 13. Further, the insulating layer 25, the wiring layer 26, the insulating layer 27 and the wiring layer 28 are formed on the insulating layer 23. The material, the thickness and the like of each layer are explained above with reference to FIG. 1. Here, the metal layer 180 illustrated in FIG. 4A is a layer to be the wiring layer 18 and is formed on the upper surface of the insulating layer 17 as well as being filled in the via holes 17x (the entire surface of the insulating layer 17, for example). The metal layer 180 may be formed by the semi-additive method that is explained above with reference to FIG. 3C in which a resist layer is not formed on a seed layer and an electrolytic plating layer is formed on the entire surface of the seed layer, for example.

Figure 4B:
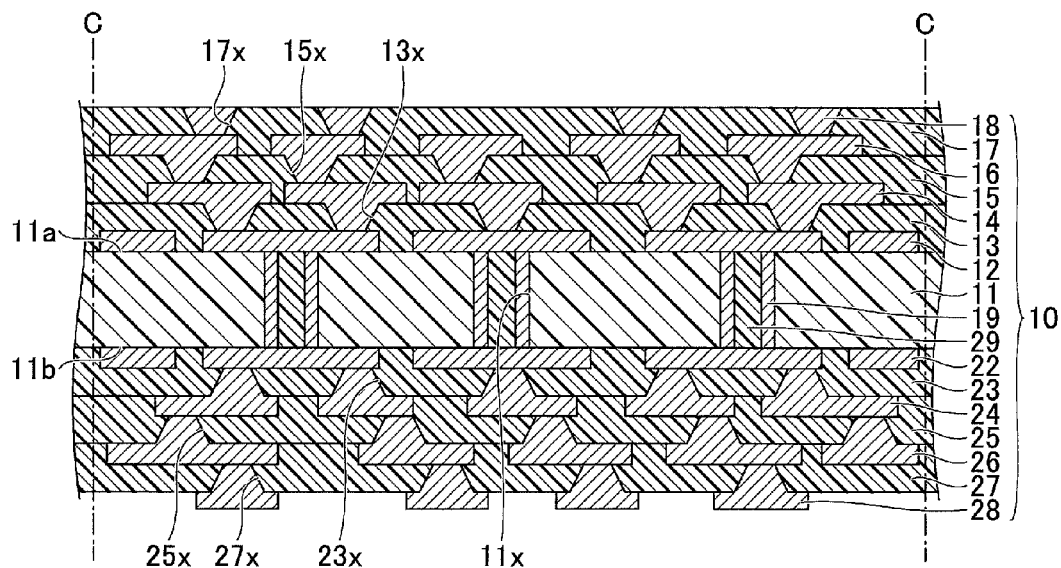

Next, in a process illustrated in FIG. 4B, the metal layer 180 is polished to expose the upper surface (first surface) of the insulating layer 17 and remove the metal layer 180 formed outside of the via holes 17x to form the wiring layer 18 including the via wirings filled in the via holes 17x, respectively. The wiring layer 18 may be formed by removing the metal layer 180 except the parts filled in the via holes 17x by chemical mechanical polishing (CMP) or the like, for example. At this time, a part of the upper surface of the insulating layer 17 may be removed. Thus, the upper surface of the wiring layer 18 and the upper surface of the insulating layer 17 may be flush with each other, for example. As described above, the upper surface of the insulating layer 17 and the upper surface of the wiring layer 18 (upper end surface of the via wiring) are polished surfaces and are smooth surfaces.

Here, by removing the part of the upper surface of the insulating layer 17 by polishing the upper surface of the insulating layer 17 with the metal layer 180, roughness of the upper surface of the insulating layer 17 can be smaller compared with that of before polishing. This means that smoothness of the upper surface of the insulating layer 17 can be improved. In other words, the upper surface of the insulating layer 17 is smoother than the upper surface of other insulating layer (13 or 15) of the first wiring component 10. The roughness of the upper surface of the insulating layer 17 before performing CMP (before polishing) is about Ra 300 to 400 nm, and the roughness of the upper surface of the insulating layer 17 can be about Ra 15 to 40 nm by performing CMP, for example. As such, by reducing roughness of the upper surface of the insulating layer 17 to improve smoothness, fine wirings (high density wiring pattern) can be formed in the subsequent process. With the above processes, the first wiring component 10 is formed.

Next, in processes illustrated in FIG. 5A to FIG. 9, the second wiring component 30 is manufactured. First, in a process illustrated in FIG. 5A, the wiring layer 31 having a predetermined pattern in a plane view is formed on the first surface of the insulating layer 17 of the first wiring component 10. The wiring layer 31 is electrically connected to the wiring layer 18 of the first wiring component 10. The material of the wiring layer 31 may be copper (Cu) or the like, for example. The wiring layer 31 may be formed by a semi-additive method or the like.

Figure 5A:
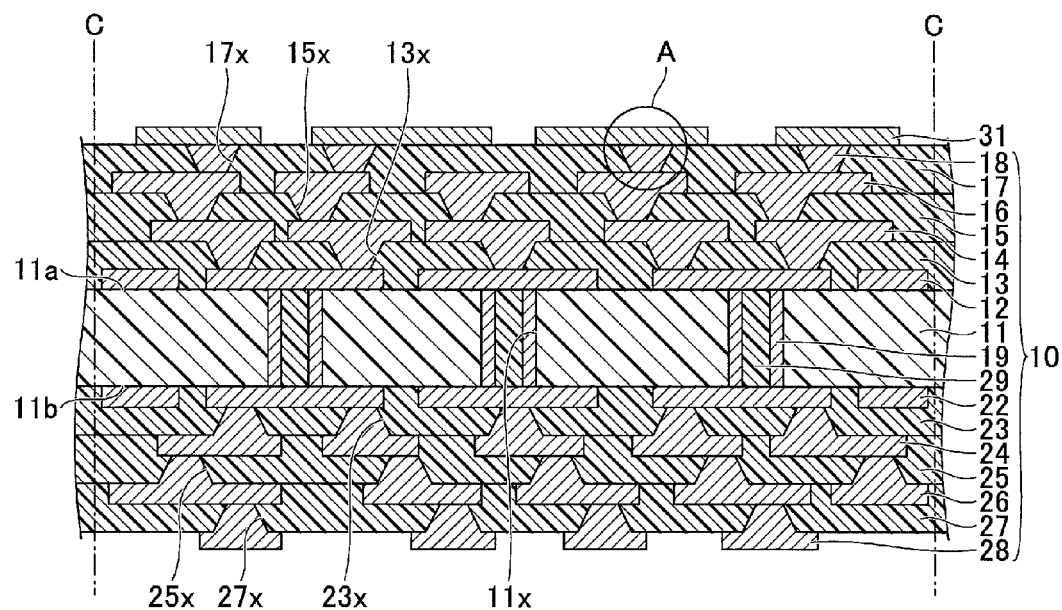
FIG. 5A and FIG. 5B are views illustrating an example of a manufacturing step of the wiring board of the first embodiment.
Figure 5B:
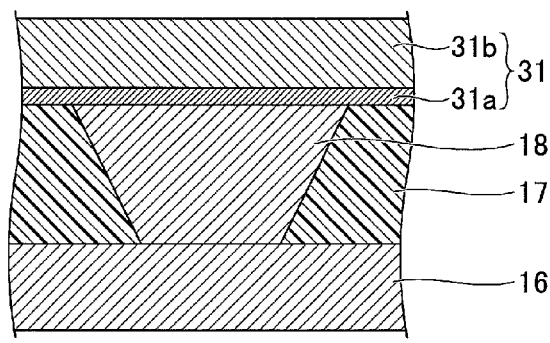

FIG. 5B is an enlarged view of a portion "A" in FIG. 5A. As illustrated in FIG. 5B, when the wiring layer 31 is formed by the semi-additive method, the wiring layer 31 has a stacked structure including a seed layer 31a and an electrolytic plating layer 31b that is formed on the seed layer 31a. The upper surface of the wiring layer 18 is connected to the electrolytic plating layer 31b through the seed layer 31a.

The semi-additive method is as described above. Further, at this time, the seed layer 31a may be formed by stacking a titanium (Ti) layer and a copper (Cu) layer by sputtering, for example. The thickness of the titanium (Ti) layer may be about 20 to 50 nm, for example. The thickness of the copper (Cu) layer may be about 100 to 300 nm, for example. By forming the titanium (Ti) layer as a lower layer of the seed layer 31a, adherence between the insulating layer 17 and the wiring layer 31 can be improved. Titanium nitride (TiN) or the like may be used instead of titanium (Ti). Here, titanium (Ti) or titanium nitride (TiN) has a corrosion resistance higher than that of copper. Thereafter, as described above, the electrolytic plating layer 31b of copper (Cu) or the like is stacked on the seed layer 31a by electroplating using the seed layer 31a as a power supply layer. Thus, the wiring layer 31 is formed.

Before forming the seed layer 31a, a plasma process such as O₂ plasma asking or the like may be performed on the upper surface of the insulating layer 17. By performing the plasma process, the upper surface of the insulating layer 17 can be roughened. By roughening the upper surface of the insulating layer 17, adherence with the seed layer 31a can be increased. However, as described above, by reducing the roughness of the upper surface of the insulating layer 17 to improve smoothness, fine wirings can be formed. If necessary in the process of roughening the upper surface of the insulating layer 17, the upper surface of the insulating layer 17 is roughed to an amount that does not cause an influence in forming the fine wirings.

Figure 6A:
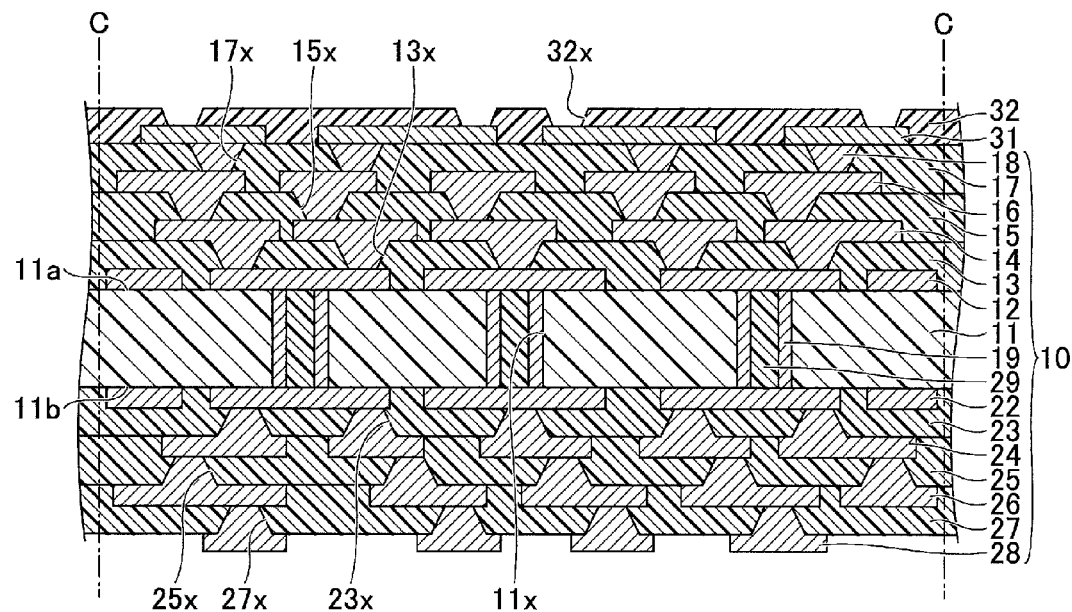
FIG. 6A and FIG. 6B are views illustrating an example of a manufacturing step of the wiring board of the first embodiment.

Next, in a process illustrated in FIG. 6A, the insulating layer 32 is formed on the first surface of the insulating layer 17 of the first wiring component 10 such as to cover the wiring layer 31. Then, the via holes 32x are formed in the insulating layer 32 to be penetrated the insulating layer 32 to expose the upper surface of the wiring layer 31. The material of the insulating layer 32 may be photosensitive insulating resin including phenol-based resin, polyimide-based resin or the like as a main constituent, for example. The thickness of the insulating layer 32 may be about 5 to 10 μm, for example. The insulating layer 32 may include filler such as silica (SiO₂) or the like. The specific method of forming the insulating layer 32 is the same as that for the insulating layers 13 and 23 explained above with reference to FIG. 3A. At this time, the insulating layer 32 is not cured yet. The via holes 32x may be formed by photolithography, for example. In other words, the via holes 32x are formed by exposing and developing the insulating layer 32 including the photosensitive insulating resin as a main constituent and then curing the insulating layer 32.

Figure 6B:
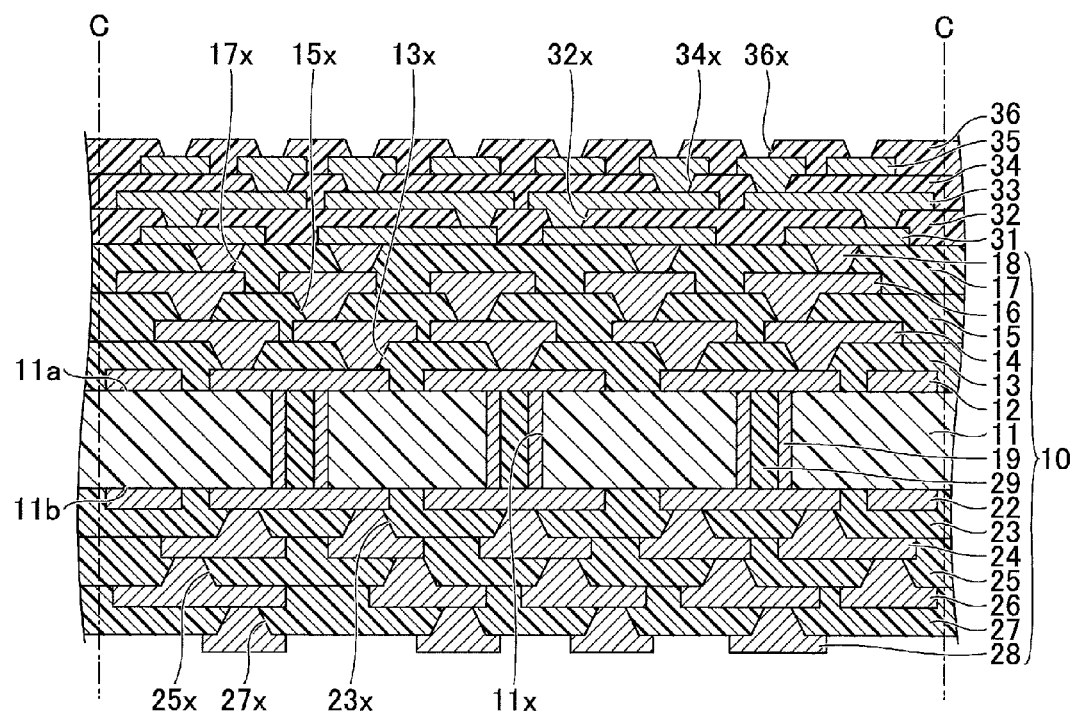

Next, in a process illustrated in FIG. 6B, the wiring layer 33, the insulating layer 34, the wiring layer 35 and the insulating layer 36 are formed on the insulating layer 32 by repeating the processes as described above with reference to FIG. 5A and FIG. 6A. Thereafter, the insulating layer 36 is provided with the via holes 36x that penetrate the insulating layer 36 to expose the upper surface of the wiring layer 35. The material, the thickness, the diameter and the like of each of the layers may be the same as those of the wiring board 1.

Figure 7A:
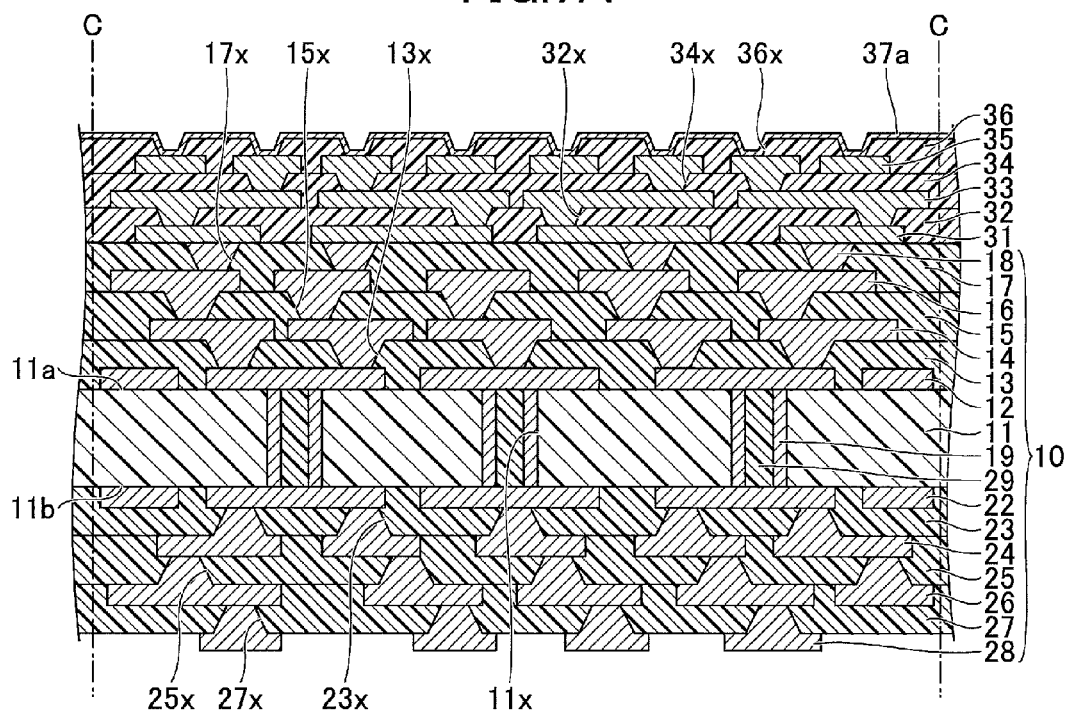
FIG. 7A and FIG. 7B are views illustrating an example of a manufacturing step of the wiring board of the first embodiment.

Next, in a process illustrated in FIG. 7A, the seed layer 37a that continuously covers the upper surface of the wiring layer 35 exposed at the bottom portion of each of the via holes 36x, the inner wall surface of each of the via holes 36x and the upper surface of the insulating layer 36 is formed by electroless plating or a sputtering method, for example. The seed layer 37a may be formed by stacking a titanium (Ti) layer and a copper (Cu) layer, for example. The thickness of the titanium (Ti) layer may be about 20 to 50 nm, for example, and the thickness of the copper (Cu) layer may be about 100 to 300 nm, for example. Titanium nitride (TiN) or the like may be used instead of titanium (Ti).

Figure 7B:
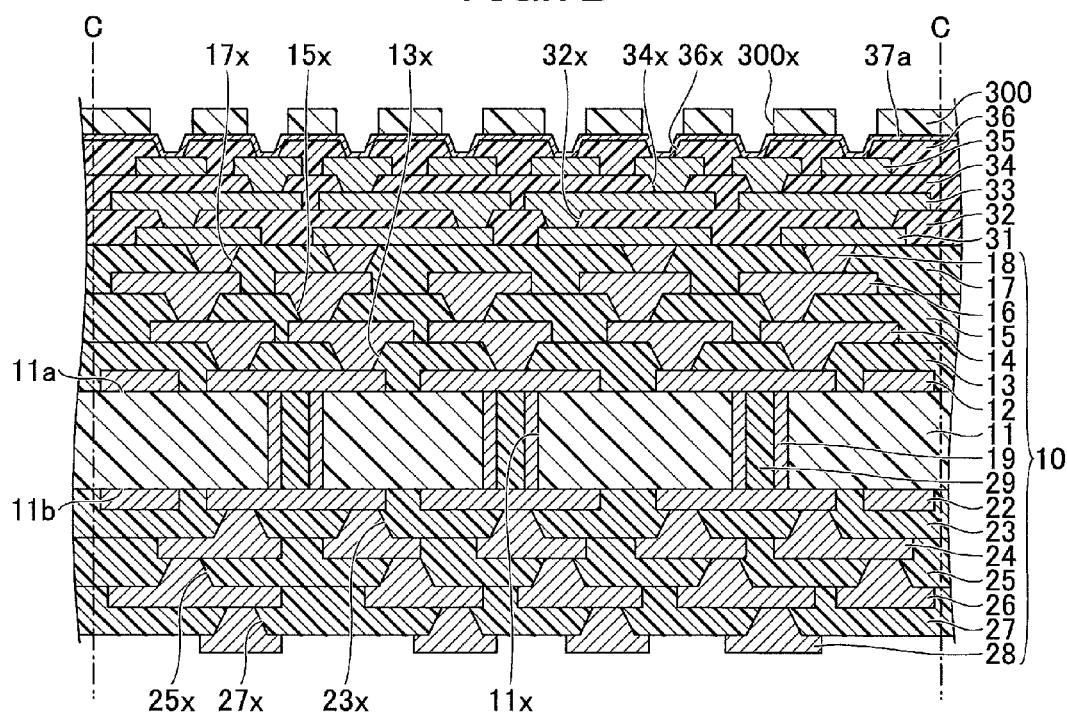

Next, in a process illustrated in FIG. 7B, the resist layer 300 provided with the open portions 300x corresponding to the wiring layer 37 is formed on the seed layer 37a that is formed at the upper surface of the insulating layer 36. Next, in a process illustrated in FIG. 8A, the electrolytic plating layer 37b of copper (Cu) or the like is formed at the open portions 300x of the resist layer 300 by electroplating using the seed layer 37a as a power supply layer.

Figure 8A:
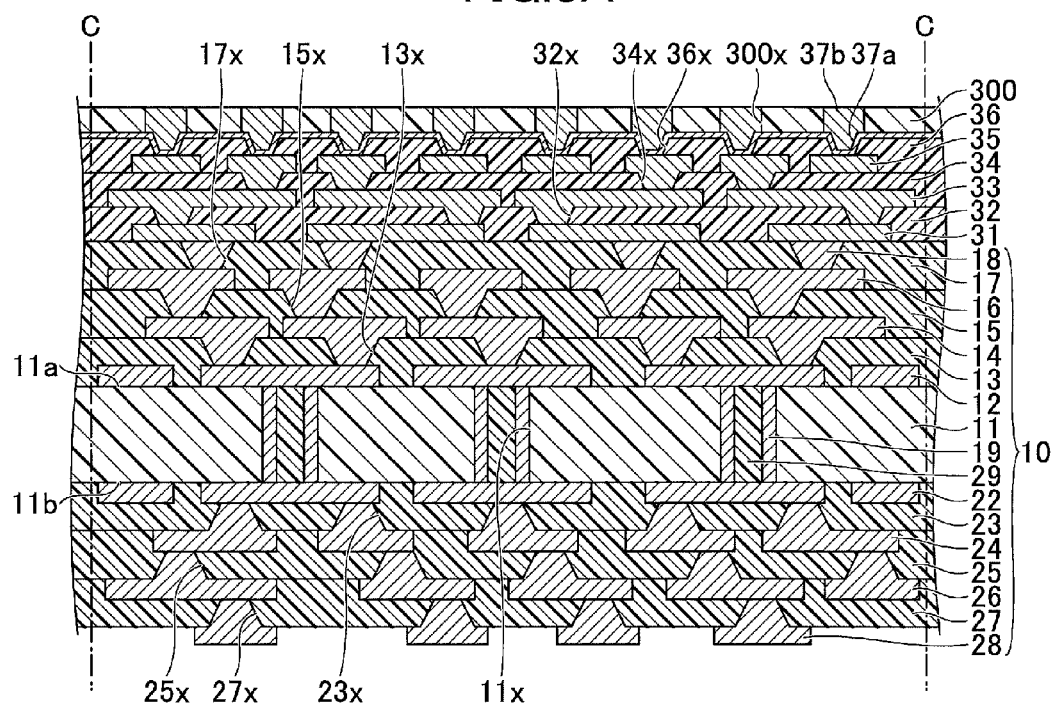
FIG. 8A and FIG. 8E are views illustrating an example of a manufacturing step of the wiring board of the first embodiment.
Figure 8B:
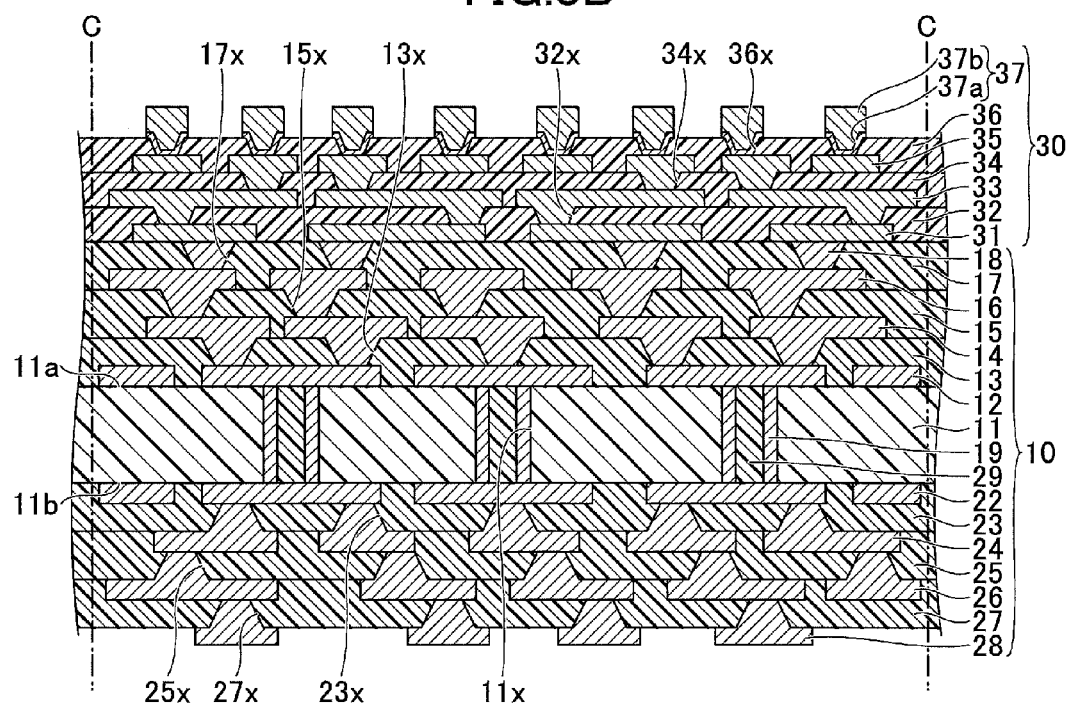

Next, in a process illustrated in FIG. 8B, after removing the resist layer 300 illustrated in FIG. 8A, the seed layer 37a that is not covered by the electrolytic plating layer 37b is removed by etching using the electrolytic plating layer 37b as a mask. With this, the wiring layer 37 including the seed layer 37a and the electrolytic plating layer 37b that is stacked on the seed layer 37a is formed. Each of the pads of the wiring layer 37 has a circular shape whose diameter is about 20 to 30 μm in a plane view. Thereafter, the above described surface processing layer may be formed at the surface (upper surface and side surface, or only at upper surface) of each of the pads of the wiring layer 37. With the above processes, the second wiring component 30 is formed.

Figure 9:
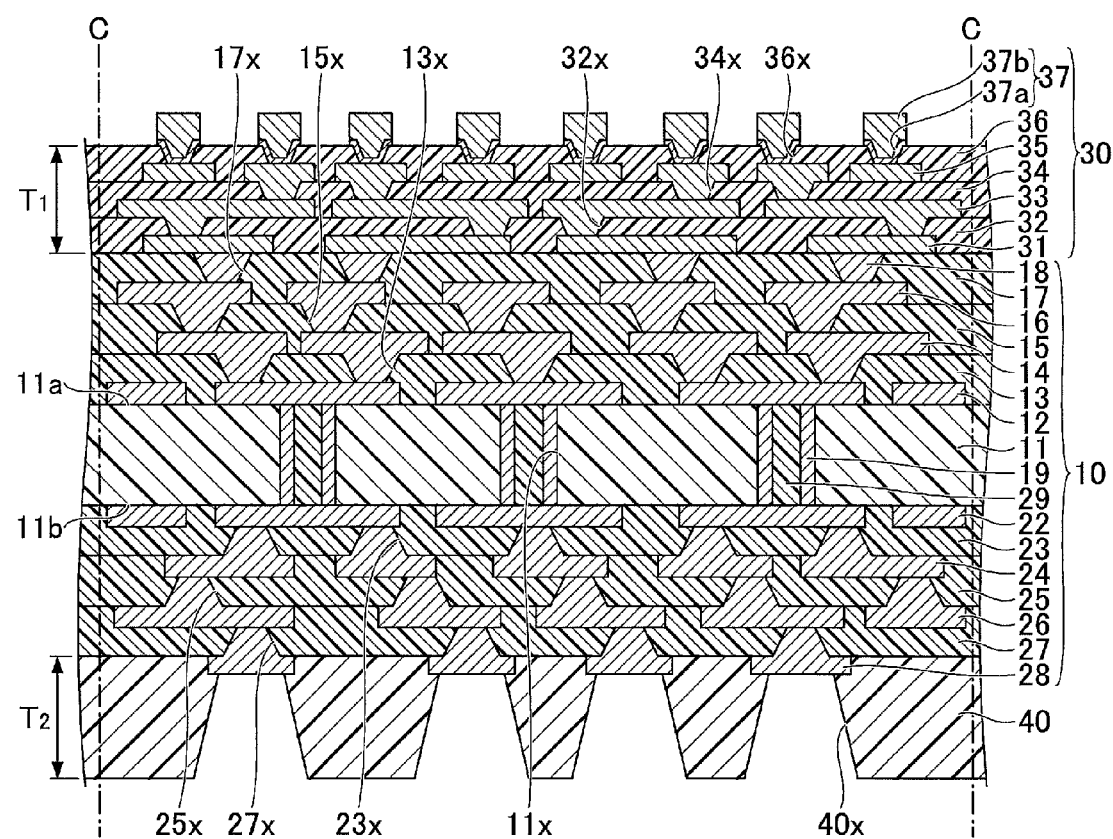
FIG. 9 is a view illustrating an example of a manufacturing step of the wiring board of the first embodiment.

Next, in a process illustrated in FIG. 9, the solder resist layer 40, which is the outermost insulating layer, is formed at the second surface of the insulating layer 27 of the first wiring component 10 such that to cover the wiring layer 28 of the first wiring component 10. The solder resist layer 40 is formed such that the thickness $T_2$ of the solder resist layer 40 becomes more than or equal to the thickness $T_1$ of the second wiring component 30. The ratio ($T_1/T_2$) of the thickness $T_1$ of the second wiring component 30 with respect to the thickness $T_2$ of the solder resist layer 40 may be less than or equal to 0.75. The solder resist layer 40 may be formed by a method same as that for the insulating layer 32 explained above with reference to FIG. 6A.

Thereafter, the open portions 40x may be formed by a method similar to the method for forming the via holes 32x explained above with reference to FIG. 6A. A portion of the wiring layer 28 of the first wiring component 10 is exposed at the bottom portion of each of the open portions 40x. The portion of the wiring layer 28 exposed at the bottom portion of each of the open portions 40x functions as a pad to be electrically connected to the mounting substrate such as the mother board or the like, for example. The surface processing layer as described above may be formed at a lower surface of the wiring layer 28 that is exposed at the bottom portion of each of the open portions 40x.

For example, when forming the surface processing layer at the lower surface of the wiring layer 28 that is exposed at the bottom portion of each of the open portions 40x by performing the OSP process for the case when both of the electrolytic plating layer 37b and the wiring layer 28 are copper (Cu), it is necessary to mask the exposed portion of the electrolytic plating layer 37b so that the surface processing layer is not formed on the exposed portion of the electrolytic plating layer 37b. The solder resist layer 40 may be formed after the process illustrated in FIG. 4A or after the process illustrated in FIG. 4B.

After the process illustrated in FIG. 9, the structure illustrated in FIG. 9 is cut at cut positions C by a dicer or the like to obtain a plurality of individualized wiring boards 1 (see FIG. 1).

As such, the wiring board 1 includes the first wiring component 10 that is a low wiring density layer, the second wiring component 30 that is a high wiring density layer and formed at the first side of the first wiring component 10, and the solder resist layer 40 formed at the second side of the first wiring component 10. The first wiring component 10 includes the insulating layers each including a thermosetting resin as a main constituent and the wiring layers. The second wiring component 30 includes the insulating layers each including a photosensitive resin as a main constituent and the wiring layers. Further, the solder resist layer 40 that is an outermost insulating layer includes photosensitive resin as a main constituent. Then, the thickness $T_1$ of the second wiring component 30 is less than or equal to the thickness $T_2$ of the solder resist layer 40.

By forming the wiring board 1 to have the above structure, a balance of the physical properties (elastic coefficient and coefficient of thermal expansion) and the thickness of the stacked layers including the first wiring component 10 the center in the up and down direction can be adjusted and the warp of the wiring board 1 can be suppressed.

Alternative Example 1 of First Embodiment

In the alternative example 1 of the first embodiment, an example of a wiring board is described in which the shape of pads for mounting an electronic component is different. Here, in the alternative example 1 of the first embodiment, the same components as described above are given the same reference numerals, and explanations are not repeated.

Figure 10:
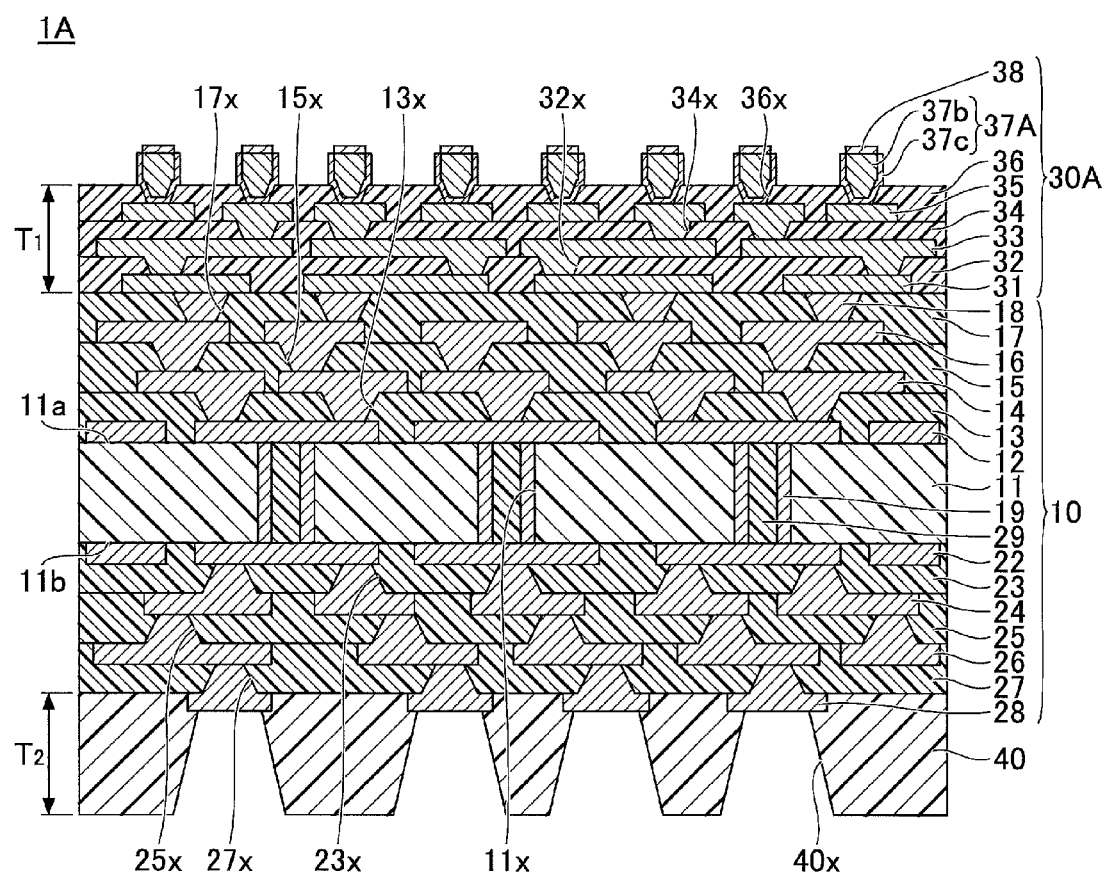
FIG. 10 is a cross-sectional view illustrating an example of the wiring board of an alternative example 1 of the first embodiment.

FIG. 10 is a cross-sectional view illustrating an example of a wiring board 1A of the alternative example 1 of the first embodiment. With reference to FIG. 10, the wiring board 1A of the alternative example 1 of the first embodiment is different from the wiring board 1 (see FIG. 1) in that the second wiring component 30 is substituted by a second wiring component 30A. In the second wiring component 30A, a wiring layer 37A is provided instead of the wiring layer 37 of the second wiring component 30. Further, a surface processing layer 38 is provided on the wiring layer 37A. The thickness of the wiring layer 37A may be the same as that of the wiring layer 37, for example.

The wiring layer 37A includes a seed layer 37c and the electrolytic plating layer 37b and the bottom surface (surface at the insulating layer 36 side) and the side surface of the electrolytic plating layer 37b are covered by the seed layer 37c. In other words, the side surface of each of the pads (protruding portions) of the wiring layer 37A is covered by the seed layer 37c. The material, the thickness and the like of the seed layer 37c may be the same as those of the seed layer 37a, for example.

Each of the pads of the wiring layer 37A may have a circular shape in a plan view, for example. At this time, the diameter of each of the pads of the wiring layer 37A may be larger than that of the open portion of the via hole 36x (about 10 to 20 μm, for example), and may be about 20 to 30 μm, for example. The pitch of the pads of the wiring layer 37A may be about 40 to 50 μm, for example. The pads of the wiring layer 37A function as pads to be electrically connected to an electronic component such as a semiconductor chip or the like for mounting the electronic component.

A surface processing layer 38 is formed on the upper surface (the upper surface of the electrolytic plating layer 37b) of the pads (protruding portions) of the wiring layer 37A. As an example of the surface processing layer 38, an Au layer, a Ni/Au layer (a metal layer including a Ni layer and an Au layer stacked in this order), a Ni/Pd/Au layer (a metal layer including a Ni layer, a Pd layer and an Au layer stacked in this order) or the like may be used. Further, the surface processing layer 38 may be formed by performing an antioxidation process such as an OSP process or the like to the upper surface of the pads of the wiring layer 37A.

Figure 11A:
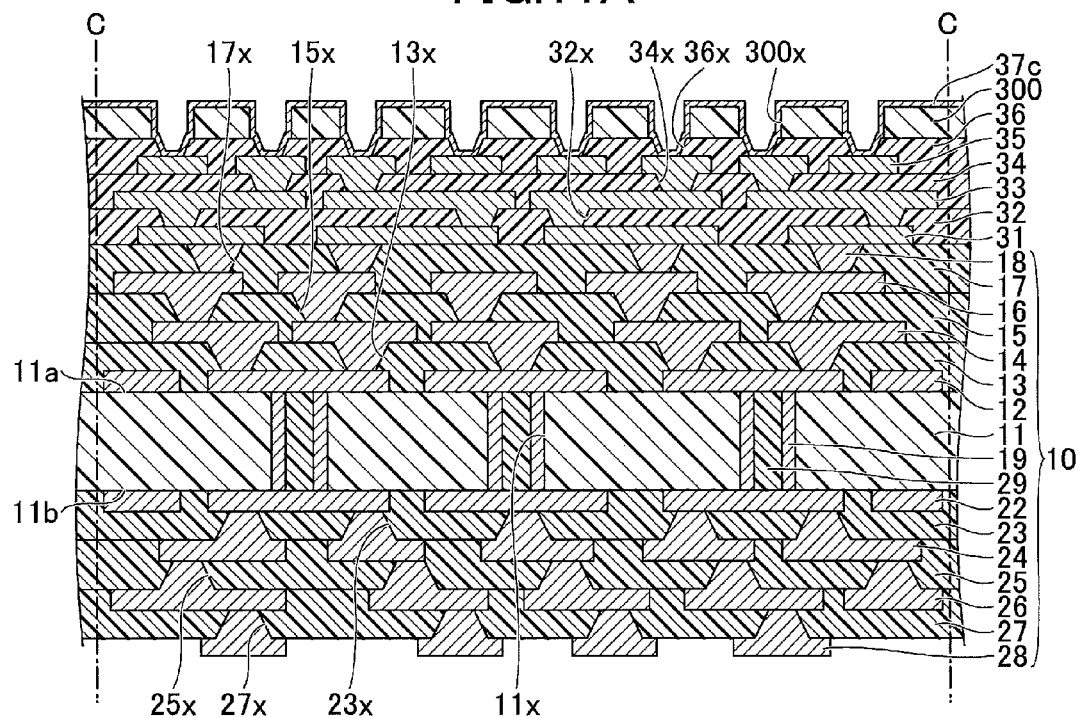
FIG. 11A and FIG. 11B are views illustrating an example of a manufacturing step of the wiring board of the alternative example 1 of the first embodiment.
Figure 11B:
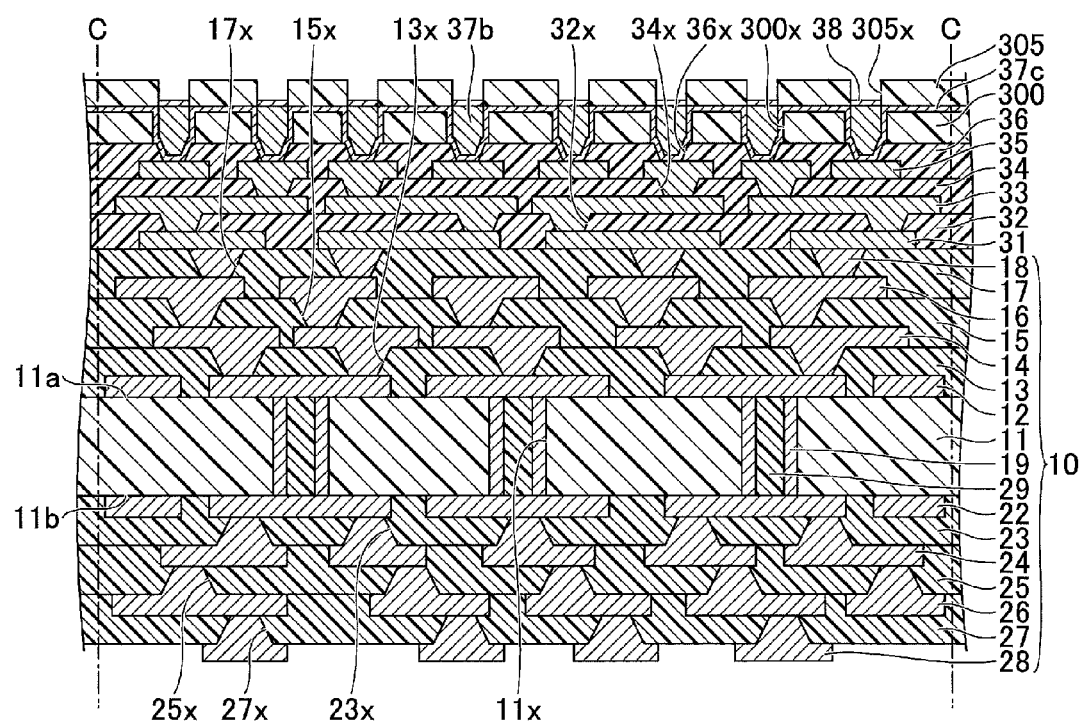

The wiring layer 37A and the surface processing layer 38 may be formed by the following step. FIG. 11A and FIG. 11B are views illustrating a manufacturing step of the wiring board 1A of the alternative example 1 of the first embodiment. Although an example of a manufacturing step in which a part corresponding to a plurality of wiring boards is firstly manufactured and then, the plurality of wiring boards are obtained by individualizing the part in this embodiment, a manufacturing step in which each single wiring board is manufactured may be alternatively used.

First, after performing the processes as described above in the first embodiment with reference to FIG. 2A to FIG. 6B, in a process illustrated in FIG. 11A, similar to the process as described above in the first embodiment with reference to FIG. 7B, a resist layer 300 is formed on the insulating layer 36. The resist layer 300 is provided with open portions 300x corresponding to the wiring layer 37A. Thereafter, a seed layer 37c that continuously covers an upper surface of the wiring layer 35 exposed at the bottom portion of each of the via holes 36x, the inner wall surface of each of the via holes 36x, the inner wall surface of each of the open portion 300x and an upper surface of the resist layer 300 is formed, for example. The seed layer 37c may be formed by electroless plating, a sputtering method or the like, for example. The material and the thickness of the seed layer 37c may be the same as those of the seed layer 37a, for example.

Next, in a process illustrated in FIG. 11B, a photosensitive resist layer 305 is formed on the seed layer 37c. Then, open portions 305x that are substantially in communication with the open portions 300x, respectively, are formed in the photosensitive resist layer 305 by exposure and developing. Thus, the resist layer 305 is provided to only cover the upper surface of the seed layer 37c. Then, an electrolytic plating layer 37b and the surface processing layer 38 are formed on the seed layer 37c exposed in each of the open portions 305x by electroplating using the seed layer 37c as a power supply layer, in this order.

After the process illustrated in FIG. 11B, the resist layer 305 is removed. Then, similar to the process as described above, the seed layer 37c and the resist layer 300 are selectively removed.

With this, the wiring layer 37A including the electrolytic plating layer 37b whose bottom surface (surface at the insulating layer 36 side) and the side surface are covered by the seed layer 37c is formed, and the surface processing layer 38 is formed at the upper surface (upper surface of the electrolytic plating layer 37b) of the pads of the wiring layer 37A.

Figure 12:
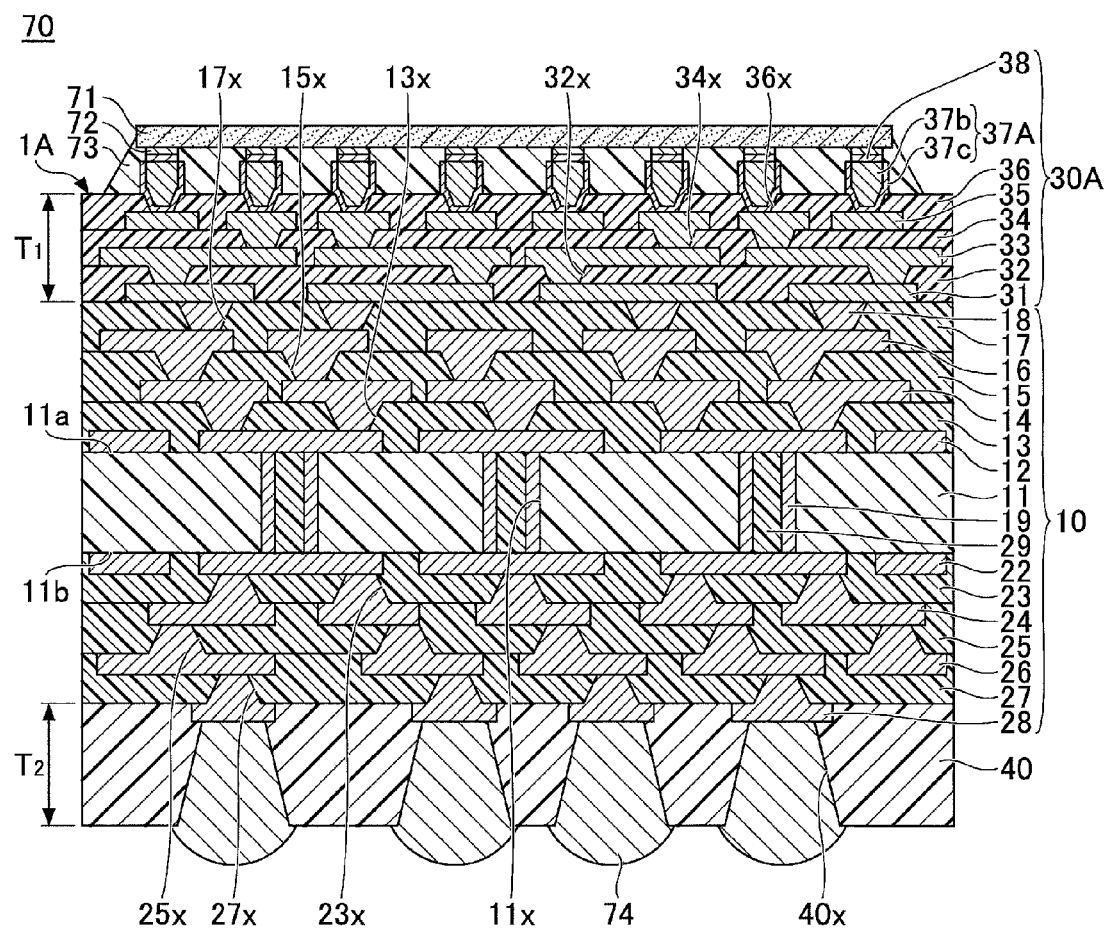
FIG. 12 is a cross-sectional view illustrating an example of a semiconductor package of the alternative example 1 of the first embodiment.

Next, as an applied example of the wiring board 1A, a semiconductor package including the wiring board 1A and a semiconductor chip mounted on the wiring board 1A is explained. FIG. 12 is a cross-sectional view illustrating an example of a semiconductor package 70 of the alternative example 1 of the first embodiment. With reference to FIG. 12, the semiconductor package 70 of the alternative example 1 of the first embodiment includes the wiring board 1A illustrated in FIG. 10 and a semiconductor chip 71 that is mounted on the wiring board 1A by flip chip.

Specifically, the surface processing layer 38 of the wiring board 1A and electrode terminals (not illustrated in the drawings) of the semiconductor chip 71 are connected through solder bumps 72 and underfill resin 73 is filled in a portion between the wiring board 1A and the semiconductor chip 71. Further, external connection terminals 74 (solder bumps) are formed at the wiring layer 28 that is exposed at the bottom portion of the open portions 40x of the solder resist layer 40. Pins or the like may be used as the external connection terminals 74 instead of the solder bumps. Further, mold resin may be used instead of the underfill resin 73.

In this embodiment, in addition to the advantage described above in the first embodiment, the following advantage is provided. As the surface processing layer 38 is formed at the upper surface of each of the pads of the wiring layer 37A, solder wettability can be improved when flip chip connecting the pads of the wiring layer 37A and the electrode terminals of the semiconductor chip 71 through the solder bumps 72.

Further, although the seed layer 37c is formed at the side surface of each of the pads of the wiring layer 37A, the titanium (Ti) layer, the titanium nitride (TiN) layer or the like whose solder wettability is worse than that of the surface processing layer 38 is exposed at an outermost surface of the seed layer 37c. Thus, only the surface processing layer 38 having good solder wettability can wet with solder of the solder bump 72 so that solder can be prevented from flowing on the titanium (Ti) layer, the titanium nitride (TiN) layer or the like of the side surface of the pads of the wiring layer 37A. As a result, the wiring board 1A can be connected to the semiconductor chip 71 including the electrode terminals with a fine and narrow pitch.

Further, different from the wiring layer 37, as the side surface of each of the pads in the wiring layer 37A is covered by the seed layer 37c including titanium (Ti), titanium nitride (TiN) or the like whose corrosion resistance is higher than that of copper, antioxidation can be improved and migration can be prevented.

Further, in the manufacturing step of the wiring board 1A, a surface processing layer may be formed at the lower surface of the wiring layer 28 that is exposed at the bottom portion of each of the open portions 40x of the solder resist layer 40 by performing an OSP process to the lower surface after forming the solder resist layer 40 and before forming the external connection terminals 74. By the OSP process, the surface processing layer is formed on the wiring layer (pads) of copper (Cu) using characteristics that imidazole compound selectively chemically reacts with copper (Cu). In this embodiment, for the wiring layer 37A, copper (Cu) is not exposed as the side surface of each of the pads of the wiring layer 37A is coated by the seed layer 37c and the surface processing layer 38 is formed at the upper surface of each of the pads of the wiring layer 37A.

Thus, the OSP process can be only performed at the lower surface of the wiring layer 28 exposed at the bottom portion of each of the open portions 40x of the solder resist layer 40 without masking the wiring layer 37A. If copper (Cu) is exposed at the wiring layer 37A, a process of masking that part is necessary. However, in this embodiment, such a process is unnecessary so that the manufacturing step can be simplified and the manufacturing cost of the wiring board 1A can be reduced.

Alternative Example 2 of First Embodiment

In an alternative example 2 of the first embodiment, an example of a wiring board is described in which the shape of pads for mounting an electronic component is different. Here, in the alternative example 2 of the first embodiment, the same components as described above are given the same reference numerals, and explanations are not repeated.

Figure 13:
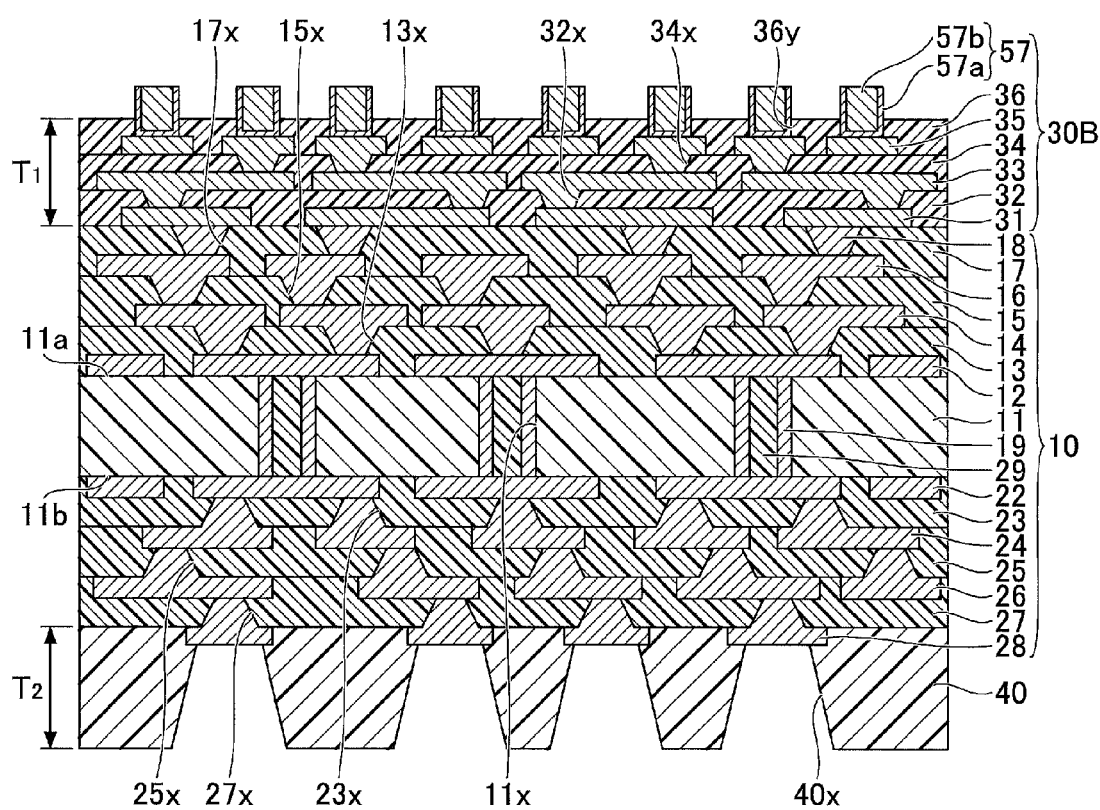
FIG. 13 is a cross-sectional view illustrating an example of the wiring board of an alternative example 2 of the first embodiment.

FIG. 13 is a cross-sectional view illustrating an example of the wiring board 1B of an alternative example 2 of the first embodiment. With reference to FIG. 13, the wiring board 1B of the alternative example 2 of the first embodiment is different from the wiring board 1 (see FIG. 1) in that the second wiring component 30 is substituted by a second wiring component 30B. In the second wiring component 30B, via holes 36y and a wiring layer 57 are provided instead of the via hole 36x and the wiring layer 37 of the second wiring component 30, respectively.

The wiring layer 57 is provided at a first side of the insulating layer 36. The wiring layer 57 includes via wirings filled in the via holes 36y that are provided to penetrate the insulating layer 36 to expose the first surface of the wiring layer 35, and pads that protrude from the first surface of the insulating layer 36. Each of the via holes 36y is a cylindrical concave portion. The diameter of the via hole 36y at an open portion may be about 20 to 30 μm, for example.

The wiring layer 57 includes a seed layer 57a and an electrolytic plating layer 57b, and a bottom surface and a side surface of the electrolytic plating layer 57b are covered by the seed layer 57a. In other words, the seed layer 57a is not formed at an upper surface of each of the pads (protruding portions) of the wiring layer 57. The material, the thickness or the like of the electrolytic plating layer 57b and the seed layer 57a may be the same as those of the electrolytic plating layer 37b and the seed layer 37a, for example.

The thickness of the wiring layer 57 (the total thickness of the electrolytic plating layer 57b and the seed layer 57a including the respective pad portion that protrudes from the first surface of the insulating layer 36) is about 10 μm, for example. Each of the pads of the wiring layer 57 may have a cylindrical shape whose diameter is about 20 to 30 μm, for example. In other words, the diameter of each of the via wirings and the diameter of each of the pad portions are the same, and may be about 20 to 30 μm, for example. The pitch of the pads of the wiring layer 57 may be about 40 to 50 μm, for example. The pads of the wiring layer 57 function as pads to be electrically connected to an electronic component such as a semiconductor chip or the like for mounting the electronic component. Here, a surface processing layer, not illustrated in the drawings, may be formed at a surface (at an upper surface) of the pads of the wiring layer 57. An advantage of forming the surface processing layer is the same as that explained in the alternative example 1 of the first embodiment.

The wiring layer 57 may be formed by the following step. FIG. 14A to FIG. 15B are views illustrating a manufacturing step of the wiring board 1B of the alternative example 2 of the first embodiment. Although an example of a manufacturing step in which a part corresponding to a plurality of wiring boards is firstly manufactured and then, the plurality of wiring boards are obtained by individualizing the part in this embodiment, a manufacturing step in which each single wiring board is manufactured may be alternatively used.

Figure 14A:
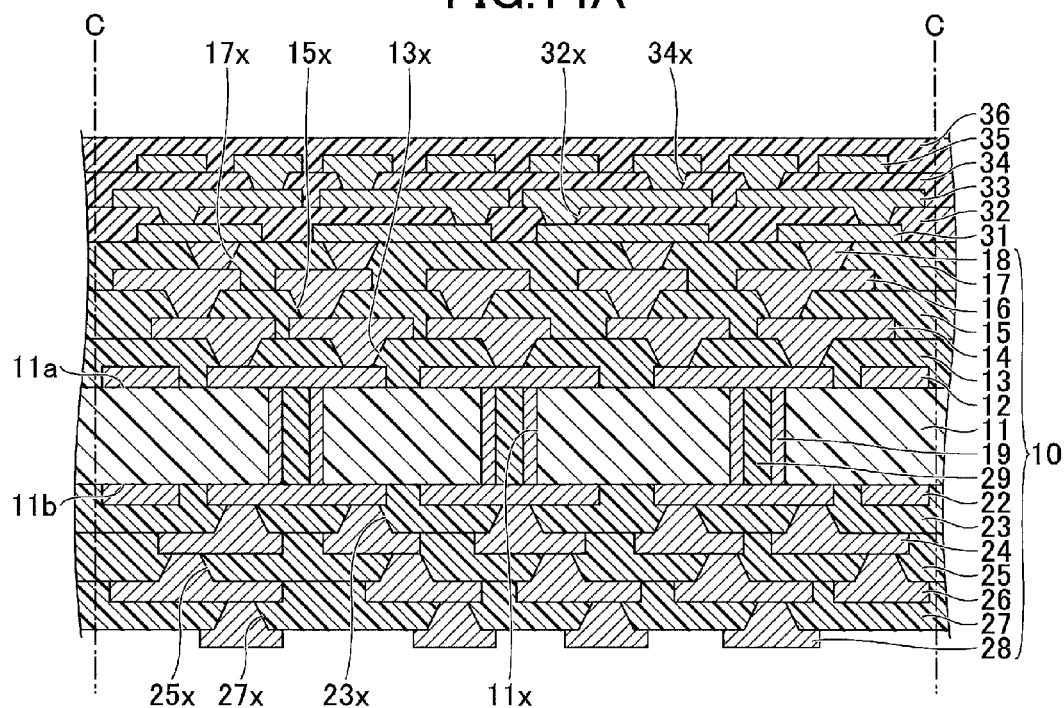
FIG. 14A and FIG. 14B are views illustrating an example of a manufacturing step of the wiring board of the alternative example 2 of the first embodiment.

First, after performing the processes as described above in the first embodiment with reference to FIG. 2A to FIG. 6A, in a process illustrated in FIG. 14A, the wiring layer 33, the insulating layer 34, the wiring layer 35 and the insulating layer 36 are formed on the insulating layer 32 by repeating the processes as described above with reference to FIG. 5A and FIG. 6A.

Figure 14B:
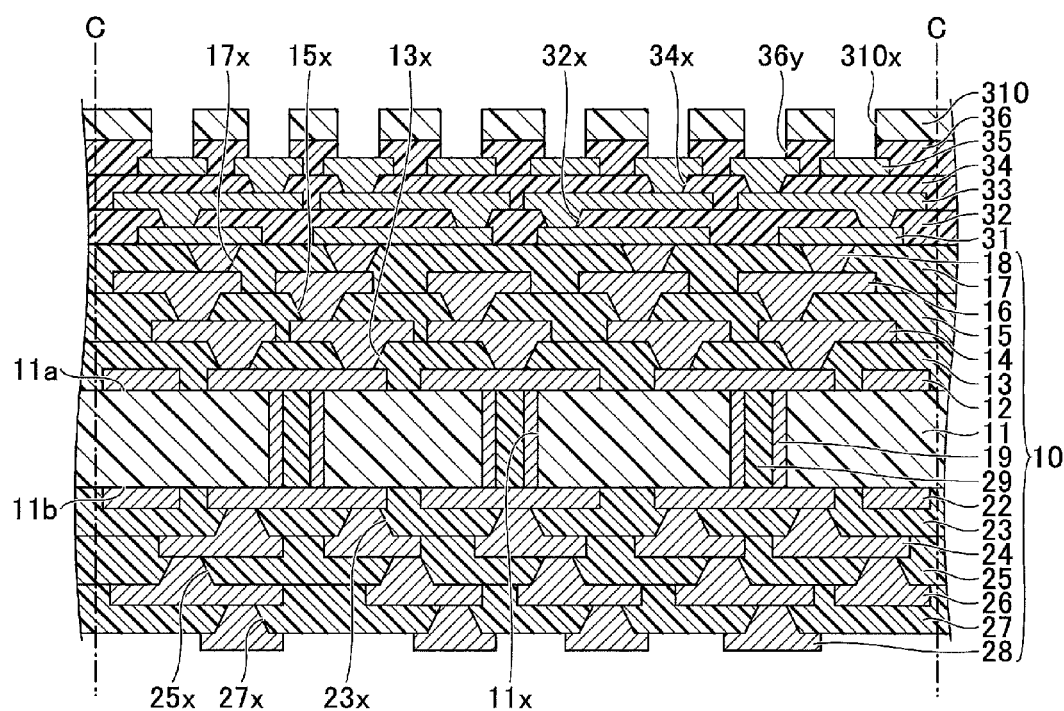

Next, in a process illustrated in FIG. 14B, a photosensitive resist layer 310 is formed on the upper surface of the insulating layer 36 and open portions 310x are formed in the photosensitive resist layer 310 by exposing and developing. Next, the insulating layer 36 exposed in each of the open portions 310x is removed by dry etching or the like to form the via holes 36y that are in communication with the open portions 310x, respectively. At this time, the upper surface of the wiring layer 35 is exposed at the bottom portion of each of the via holes 36y. The via hole 36y and the open portion 310x may have a cylindrical shape whose diameter is about 20 to 30 μm, for example. The pitch of the via holes 36y and the open portions 310x may be about 40 to 50 μm, for example.

Figure 15A:
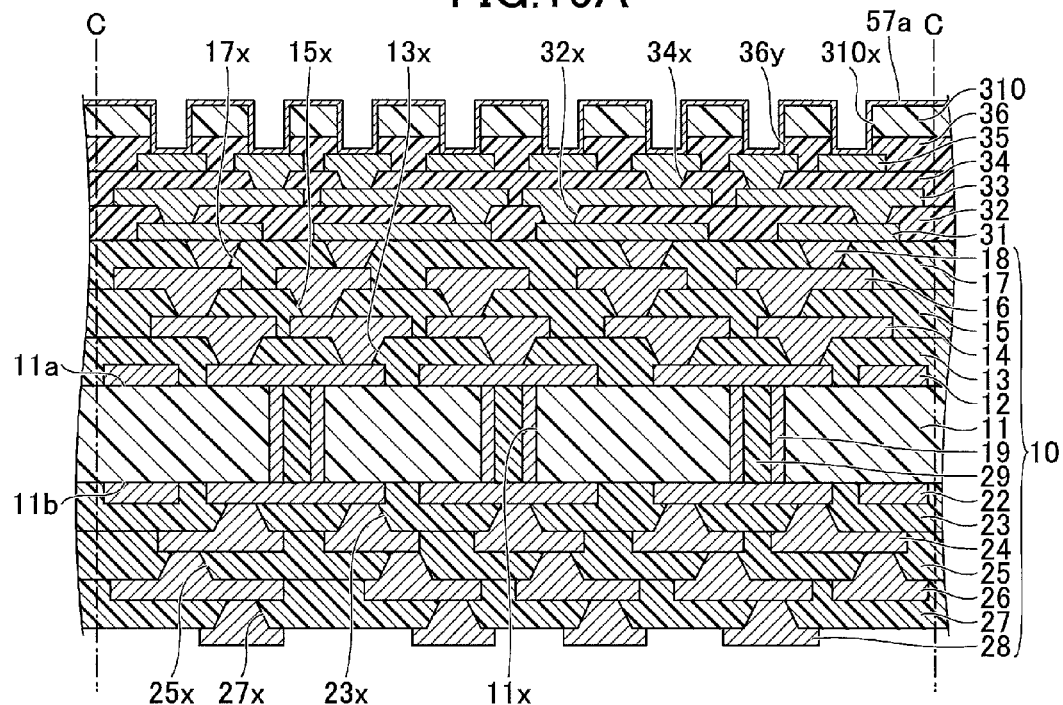
FIG. 15A and FIG. 15B are views illustrating an example of a manufacturing step of the wiring board of the alternative example 2 of the first embodiment.

Next, in a process illustrated in FIG. 15A, the seed layer 57a that continuously covers the upper surface of the wiring layer 35 exposed at the bottom portion of each of the via holes 36y, the inner wall surface of each of the via holes 36y, the inner wall surface of each of the open portions 310x and the upper surface of the resist layer 310 is formed, for example. The seed layer 57a may be formed by electroless plating, a sputtering method or the like, for example. The material and the thickness of the seed layer 57a may be the same as those of the seed layer 37a, for example.

Figure 15B:
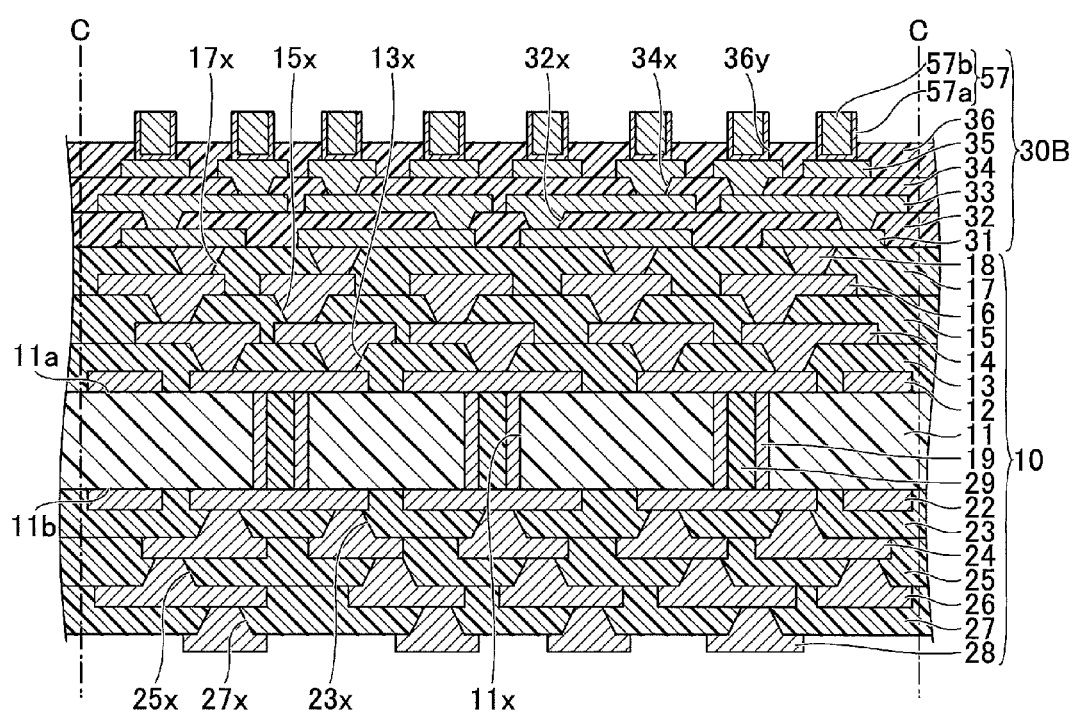

Next, in a process illustrated in FIG. 15B, after forming the wiring layer 57 including the seed layer 57a and the electrolytic plating layer 57b in each of the via holes 36y and each of the open portions 310x, the resist layer 310 is removed. Specifically, another resist layer (not illustrated in the drawings) provided with open portions corresponding to the wiring layer 57 is formed on the seed layer 57a that is formed on the upper surface of the resist layer 310. Then, the electrolytic plating layer 57b of copper (Cu) or the like is formed at the open portions of the other resist layer by electroplating using the seed layer 57a as a power supply layer.

Subsequently, after removing the other resist layer, the wiring layer 57 including the seed layer 57a and the electrolytic plating layer 57b stacked on the seed layer 57a is formed. The wiring layer 57 may have a cylindrical shape whose diameter is about 20 to 30 μm, for example. In other words, the diameter of the via wiring and the diameter of the pad portion are the same and is about 20 to 30 μm, for example.

As such, in the alternative example 2 of the first embodiment, the cylindrical wiring layer 57 in which the diameter of the via wiring and the diameter of the pad portion are the same is formed. With this, an advantage as follows in addition to the advantage of the first embodiment can be obtained. That is, compared with the wiring layer 37 of the wiring board 1 (see FIG. 1 and FIG. 9), reliability in connection with the wiring layer 35 can be improved as the area of the wiring layer 57 connected with the wiring layer 35 that is positioned right below the wiring layer 57 is large.

Further, different from the wiring layer 37, as the side surface of each of the pads in the wiring layer 57 is covered by the seed layer 57a including titanium (Ti), titanium nitride (TiN) or the like whose corrosion resistance is higher than copper, antioxidation can be improved and migration can be prevented.

Alternative Example 3 of First Embodiment

In an alternative example 3 of the first embodiment, an example of a wiring board is explained in which the first wiring component does not include the stacked structure of the plurality of insulating layers and wiring layers. Here, in the alternative example 3 of the first embodiment, the same components as described above are given the same reference numerals, and explanations are not repeated.

Figure 16:
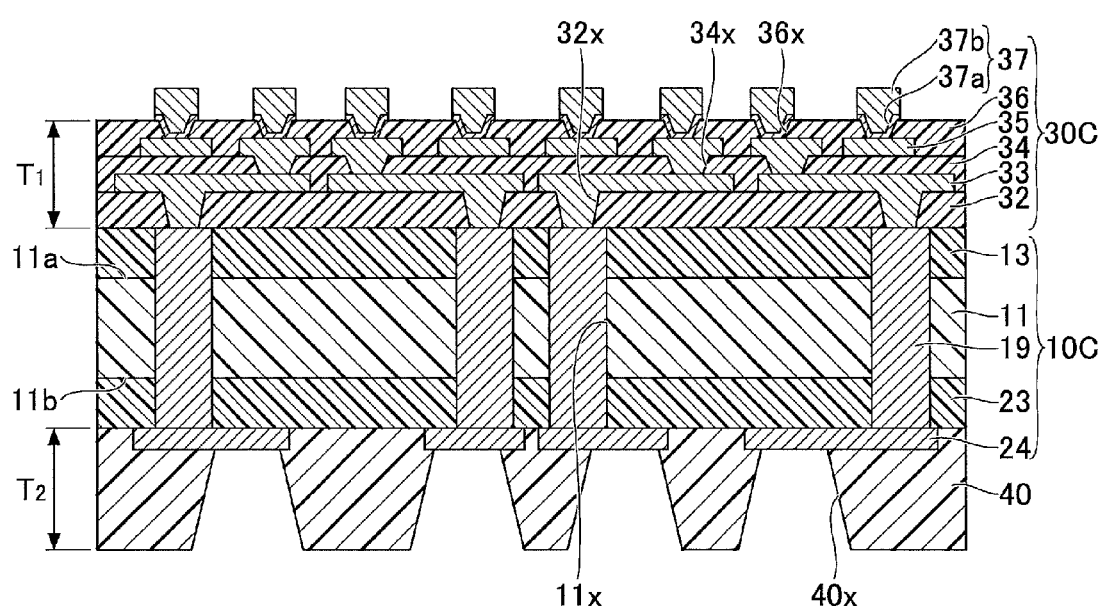
FIG. 16 is a cross-sectional view illustrating an example of the wiring board of the alternative example 3 of the first embodiment.

FIG. 16 is a cross-sectional view illustrating an example of a wiring board 10 of the alternative example 3 of the first embodiment. With reference to FIG. 16, the wiring board 10 of the alternative example 3 of the first embodiment is different from the wiring board 1 (see FIG. 1) in that the first wiring component 10 is substituted by a first wiring component 10C and the second wiring component 30 is substituted by a second wiring component 30C.

In the first wiring component 10C, only the insulating layer 13 is formed on the first surface 11a of the core layer 11 and the insulating layer 23 and the wiring layer 24 are formed on the second surface 11b of the core layer 11. The insulating layer 13 and the insulating layer 23 may have the same thickness. Further, the same kind of thermosetting insulating resin may be used for the insulating layer 13 and the insulating layer 23. Here, the insulating layer 13 of the first wiring component 10C is an example of a first insulating layer, and also an example of an outermost first insulating layer. The insulating layer 23 of the first wiring component 10C is an example of a third insulating layer.

The through wirings 19 (via wirings) are formed in the through holes 11x each penetrating the core layer 11, the insulating layer 13 and the insulating layer 23, respectively. Here, in the first wiring component 10C, the through wiring 19 is filled in each of the through holes 11x and a portion corresponding to the resin portion 29 of the first wiring component 10 is not provided. The upper end surface (an end surface at the second wiring component 30C side) of the through wiring 19 (via wiring) and the upper surface (a surface at the second wiring component 30C side) of the insulating layer 13 may be flush with each other, for example. The upper end surface of the through wiring 19 and the upper surface of the insulating layer 13 are polished surfaces and smooth surfaces, respectively. The lower end surface (an end surface at the solder resist layer 40 side) of the through wiring 19 (via wiring) and the lower surface (a surface at the solder resist layer 40 side) of the insulating layer 23 may be flush with each other, for example. The upper end surface (the end surface at the second wiring component 30C side) of the through wiring 19 (via wiring) is directly connected to the wiring layer 33 of the second wiring component 30C. The lower end surface (the end surface of the solder resist layer 40 side) of the through wiring 19 (via wiring) is directly connected to the wiring layer 24.

The second wiring component 30C does not include the wiring layer 31 and the lower end surface of each of the via wirings of the wiring layer 33 directly contacts the upper end surface of each of the through wirings 19. The solder resist layer 40, which is the outermost insulating layer, is formed at the second surface of the insulating layer 23 of the first wiring component 10C such that to cover the wiring layer 24 of the first wiring component 10C. The thickness $T_2$ of the solder resist layer 40 may be more than or equal to the thickness $T_1$ of the second wiring component 30C. Specifically, the ratio $(T_1/T_2)$ of the thickness $T_1$ of the second wiring component 30C with respect to the thickness $T_2$ of the solder resist layer 40 is less than or equal to 1. Furthermore preferably, the ratio $(T_1/T_2)$ may be less than or equal to 0.75.

As such, although the first wiring component 100 does not include the stacked structure of the plurality of insulating layers and wiring layers in the alternative example 3 of the first embodiment, the wiring board 10 has the same advantage as that of the first embodiment.

Second Embodiment

In the second embodiment, an example of a wiring board is explained in which a first wiring component does not include a core layer. Here, in the second embodiment, the same components as described above are given the same reference numerals, and explanations are not repeated.

Figure 17:
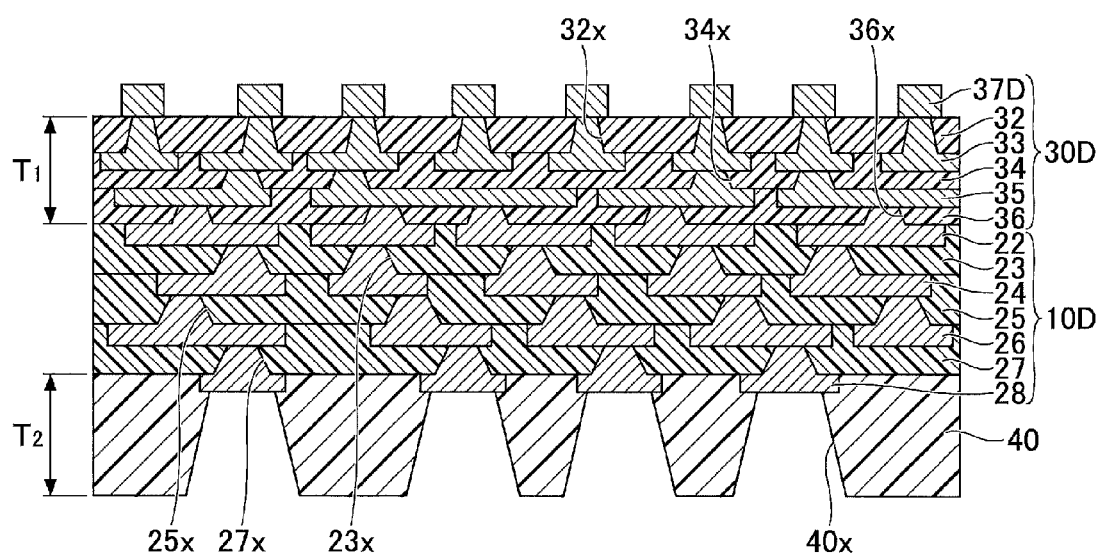
FIG. 17 is a cross-sectional view illustrating an example of the wiring board of a second embodiment.

FIG. 17 is a cross-sectional view illustrating an example of a wiring board 1D of a second embodiment. With reference to FIG. 17, the wiring board 1D of the second embodiment is different from the wiring board 1 (see FIG. 1) in that the first wiring component 10 is substituted by a first wiring component 10D and the second wiring component 30 is substituted by the second wiring component 30D.

The first wiring component 10D does not include a core layer, and includes the wiring layer 22, the insulating layer 23, the wiring layer 24, the insulating layer 25, the wiring layer 26, the insulating layer 27 and the wiring layer 28 formed in this order. A part of the wiring layer 22 is formed to extend in the via holes 36x of the second wiring component 30D and is electrically connected to the wiring layer 35 of the second wiring component 30D.

The second wiring component 30D has a stacked structure of insulating layers and wiring layers different from that of the second wiring component 30. Specifically, the insulating layer 32 provided with the via holes 32x is formed at a wiring layer 37D side that includes cylindrical pads. The wiring layer 33 is formed at the second side of the insulating layer 32 and is filled in the via holes 32x provided in the insulating layer 32 to be electrically connected to the wiring layer 37D. The insulating layer 34 is formed at the second surface of the insulating layer 32 such that to cover the wiring layer 33.

The wiring layer 35 is formed at the second side of the insulating layer 34 and is filled in the via holes 34x provided in the insulating layer 34 to be electrically connected to the wiring layer 33. The insulating layer 36 is formed at the second surface of the insulating layer 34 such that to cover the wiring layer 35. The wiring layer 22 of the first wiring component 10D is filled in the via holes 36x provided in the insulating layer 36 to be electrically connected to the wiring layer 35.

The solder resist layer 40, which is the outermost insulating layer, is formed at the second surface of the insulating layer 27 of the first wiring component 10D such that to cover the wiring layer 28 of the first wiring component 10D. The thickness $T_2$ of the solder resist layer 40 is almost the same as the thickness $T_1$ of the second wiring component 30D.

When the wiring layer 37D is formed by a semi-additive method, the wiring layer 37D includes an electrolytic plating layer and a seed layer and the bottom surface of the electrolytic plating layer is covered by the seed layer.

As such, although the first wiring component 10D does not include a core layer in the second embodiment, the warp can be suppressed even for the wiring board 1D having the above described structure, by appropriately setting the relationship between the thickness of the second wiring component 30D and the thickness of the solder resist layer 40.

Third Embodiment

In the third embodiment, an example of a semiconductor package that has a package on package (POP) structure is explained. Here, in the third embodiment, the same components as described above are given the same reference numerals, and explanations are not repeated.

Figure 18:
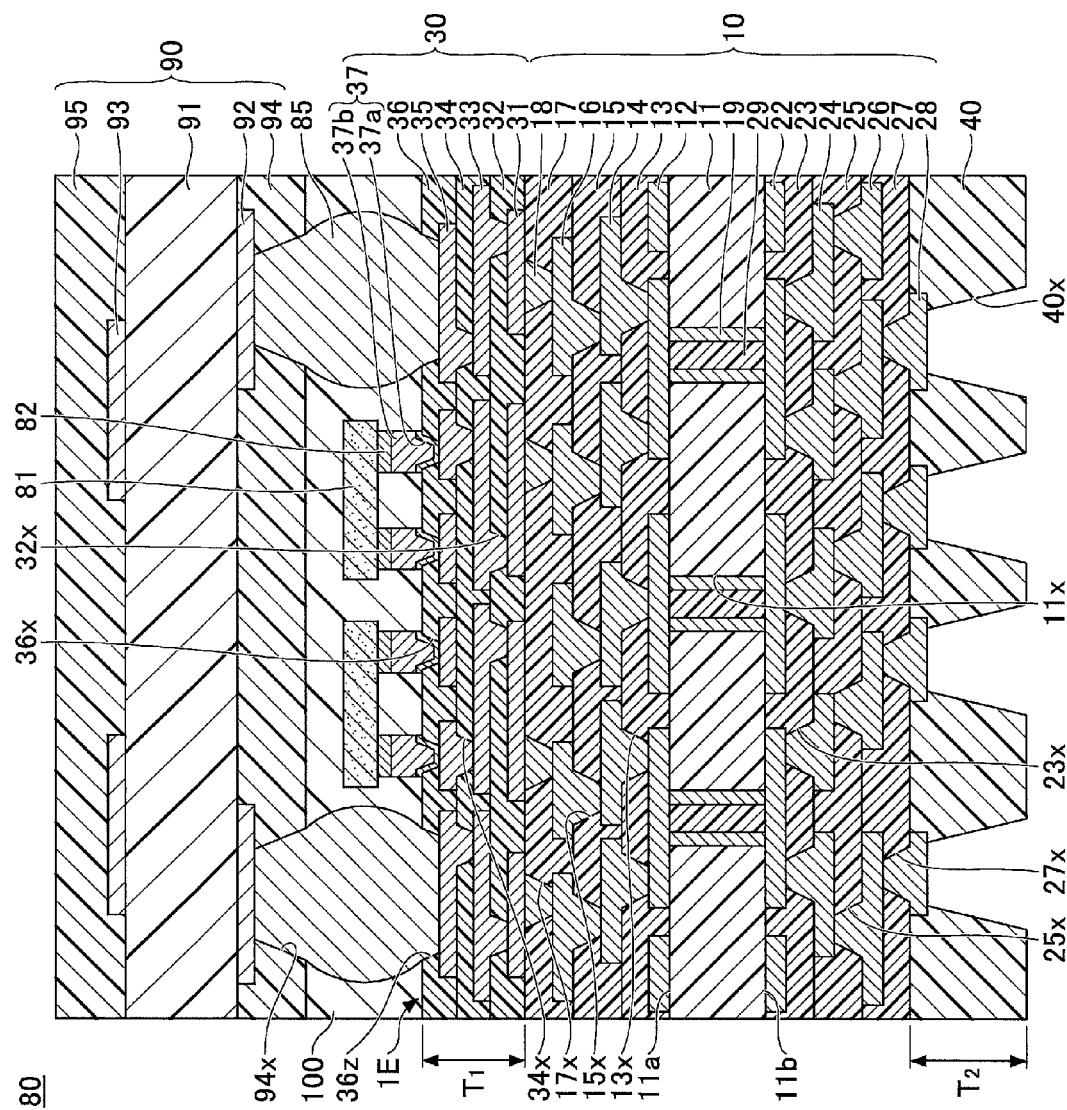
FIG. 18 is a cross-sectional view illustrating an example of the semiconductor package of a third embodiment.

FIG. 18 is a cross-sectional view illustrating an example of a semiconductor package 80 of a third embodiment. With reference to FIG. 18, the semiconductor package 80 of the third embodiment is a semiconductor package having a so-called POP (Package On Package) structure in which another wiring board 90 is mounted on a semiconductor package including a wiring board 1E and semiconductor chips 81 that are flip chip connected on the wiring board 1E, through connect portions 85.

The wiring board 1E has the similar structure as the wiring board 1 but open portions 36z that expose a part of the wiring layer 35 are provided at the insulating layer 36. Here, the surface processing layer as described above may be formed at the upper surface of the wiring layer 35 that is exposed at the bottom portion of each of the open portions 36z.

The upper surface of the wiring layer 37 of the wiring board 1E and electrode terminals (not illustrated in the drawings) of each of the semiconductor chips 81 are connected through solder bumps 82. For the example illustrated in FIG. 18, two semiconductor chips 81 are mounted. Alternatively, the number of the semiconductor chips 81 is not limited and the number of semiconductor chips 81 mounted on the wiring board 1E may be one or more than or equal to three. Further, the semiconductor chips 81 may have the same function or different function.

The wiring board 90 includes a substrate body 91, a wiring layer 92, a wiring layer 93, a solder resist layer 94 and a solder resist layer 95. For the substrate body 91, for example, a so-called epoxy-based resin in which thermosetting insulating resin or the like is impregnated in a glass cloth or the like may be used. Alternatively, a board or the like in which thermosetting insulating resin such as epoxy-based resin or the like is impregnated in a woven fabric or a nonwoven fabric such as glass fiber, carbon fiber, aramid fiber or the like may be used for the substrate body 91.

The wiring layer 92 is formed at a lower surface (second surface) of the substrate body 91. The wiring layer 93 is formed at an upper surface (first surface) of the substrate body 91. The wiring layer 92 and the wiring layer 93 may be electrically connected by through electrodes (not illustrated in the drawings) that penetrate the substrate body 91, for example. The material of the wiring layers 92 and 93 may be copper (Cu) or the like, for example.

The solder resist layer 94 is formed at the lower surface of the substrate body 91 such that to cover the wiring layer 92. The solder resist layer 95 is formed at the upper surface of the substrate body 91 such that to cover the wiring layer 93. The material of the solder resist layers 94 and 95 may be photo-sensitive insulating resin including phenol-based resin, polyimide-based resin or the like as a main constituent, for example. The solder resist layers 94 and 95 may include filler such as silica ($SiO_2$) or the like.

The solder resist layer 94 is provided with open portions 94x and a part of the wiring layer 92 is exposed at the bottom portion of each of the open portions 94x. Here, the above described surface processing layer may be formed at the lower surface of the wiring layer 92 that is exposed at the bottom portion of each of the open portions 94x. Further, the solder resist layer 95 may also be provided with open portions that expose a part of the wiring layer 93 and further another electronic component may be mounted.

The upper surface of the wiring layer 35 that is exposed at the bottom portion of each of the open portions 36z of the wiring board 1E and the lower surface of the wiring layer 92 that is exposed at the bottom portion of each of the open portions 94x of the wiring board 90 are electrically connected through the connect portions 85. As the connect portion 85, a solder ball, a copper core ball or the like may be used, for example. A space between the wiring board 1E and the wiring board 90 is filled with mold resin 100.

As warp of the wiring board 1E is reduced and the wiring board 1E has a flat shape, the wiring board 90 can easily mounted on the wiring board 1E in the semiconductor package 80. Further, as the mold resin 100 is filled in the space between the wiring board 1E and the wiring board 90, warp can be further reduced as the rigidity of the mold resin 100 is added. Further, by setting the thickness $T_1$ of the second wiring component 30: the thickness $T_2$ of the solder resist layer 40: the thickness of the solder resist layer 94: the thickness of the solder resist layer 95 to be 1:1:1:1, for example, flatness of the semiconductor package 80 can be further retained and the warp can be reduced.

Here, instead of the wiring board 1E, the wiring board 1A illustrated in FIG. 10, the wiring board 1B illustrated in FIG. 13, the wiring board 1C illustrated in FIG. 16 or the wiring board 1D illustrated in FIG. 17 provided with connect portions with the connect portions 85 may be used.

Further, the mold resin 100 may not be provided. In this case, underfill resin that coats the solder bumps 82 may be provided at the space between the semiconductor chip 81 and the wiring board 1E.

Further, an electronic component such as a semiconductor chip may be mounted instead of the wiring board 90.

Simulation of Warp

Example 1

A simulation of warp of the wiring board (referred to as a "wiring board A") having the structure illustrated in FIG. 1 was conducted. Specifically, the wiring board A was prepared to have a rectangular shape of 40 mm×40 mm in a plane view. Then, the simulation of warp of the wiring board A was conducted in which the thickness $T_2$ of the solder resist layer 40 was varied for 15 μm, 22.5 μm, 30 μm, 35 μm and 40 μm while the thickness $T_1$ of the second wiring component 30 was fixed at 22.5 μm. Here, the thickness of the first wiring component 10 was also fixed in which the thickness of the core layer 11 was 800 μm and the thickness of each of the insulating layers 13, 15, 17, 23, 25 and 27 was 25 μm.

Further, the elastic coefficient and the coefficient of thermal expansion of the core layer 11 in which thermosetting resin is impregnated in a glass cloth were set to be about 30 GPa and about 10 ppm/° C., respectively. Further, the elastic coefficient and the coefficient of thermal expansion of each of the insulating layers 13, 15, 17, 23, 25 and 27 including thermosetting resin as a main constituent were set to be about 5 to 15 GPa and about 10 to 40 ppm/° C., respectively. Further, the elastic coefficient and the coefficient of thermal expansion of each of the insulating layers 32, 34 and 36 including photosensitive resin as a main constituent were set to be about 5 GPa and about 50 to 70 ppm/° C., respectively. Further, the elastic coefficient and the coefficient of thermal expansion of the solder resist layer 40 including photosensitive resin as a main constituent were set to be about 2 to 4 GPa and about 40 to 50 ppm/° C.

Figure 19:
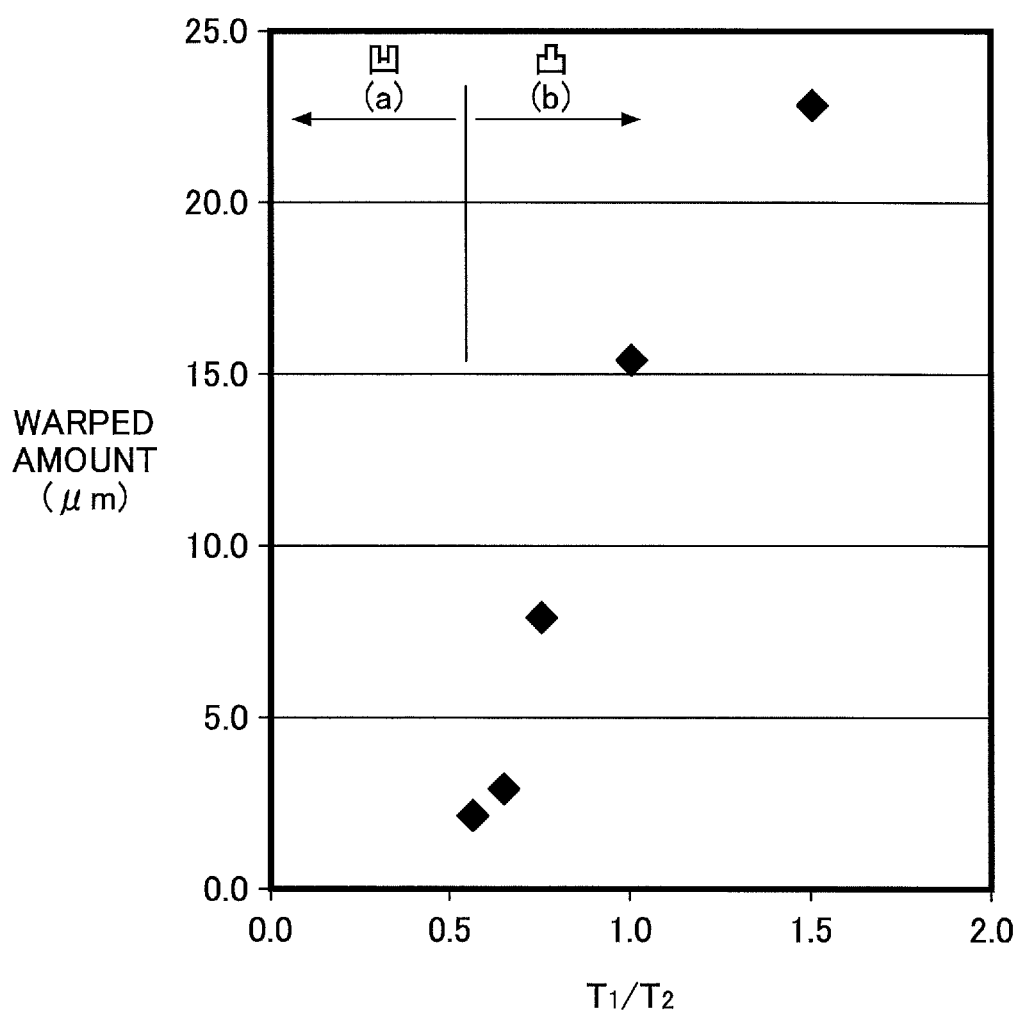
FIG. 19 is a view illustrating a simulation result of example 1.

The simulation result is illustrated in Table 1 and FIG. 19. As illustrated in Table 1 and FIG. 19, it was confirmed that the smaller the ratio $T_1/T_2$ became, in other words, the thicker the thickness $T_2$ of the solder resist layer 40 with respect to the thickness $T_1$ of the second wiring component 30 became, the less the warped amount of the wiring board A became. Further, it was also confirmed that when the ratio $T_1/T_2$ became large, the second wiring component 30 side tended to convex (protrude upwardly) (illustrated as "b"), and when the ratio $T_1/T_2$ became small, the second wiring component 30 side tended to concave (protrude downwardly) (illustrated as "a").

TABLE 1

| $T_1$ (μm) | $T_2$ (μm) | $T_1/T_2$ | WARPED AMOUNT (μm) | WARPING DIRECTION |
|---|---|---|---|---|
| 22.5 | 15.0 | 1.50 | 22.8 | (CONVEX) |
| 22.5 | 22.5 | 1.00 | 15.4 | (CONVEX) |
| 22.5 | 30.0 | 0.75 | 7.9 | (CONVEX) |
| 22.5 | 35.0 | 0.64 | 2.9 | (CONVEX) |
| 22.5 | 40.0 | 0.56 | 2.2 | (CONCAVE) |

Example 2

Another simulation of warp of the wiring board (referred to as a "wiring board B") having the structure illustrated in FIG. 1 was conducted. Specifically, the wiring board B was prepared to have a rectangular shape of 40 mm×40 mm in a plane view. Then, the simulation of warp of the wiring board B was conducted in which the thickness $T_1$ of the second wiring component 30 was varied for 18 μm, 22.5 μm, 28.5 μm, 31.5 μm and 37.5 μm while the thickness $T_2$ of the solder resist layer 40 was fixed at 30 μm. Here, the thickness of the first wiring component 10 was also fixed in which the thickness of the core layer 11 was 800 μm and the thickness of each of the insulating layers 13, 15, 17, 23, 25 and 27 was 25 μm. The elastic coefficient and the coefficient of thermal expansion of each layer were the same as those of example 1.

Figure 20:
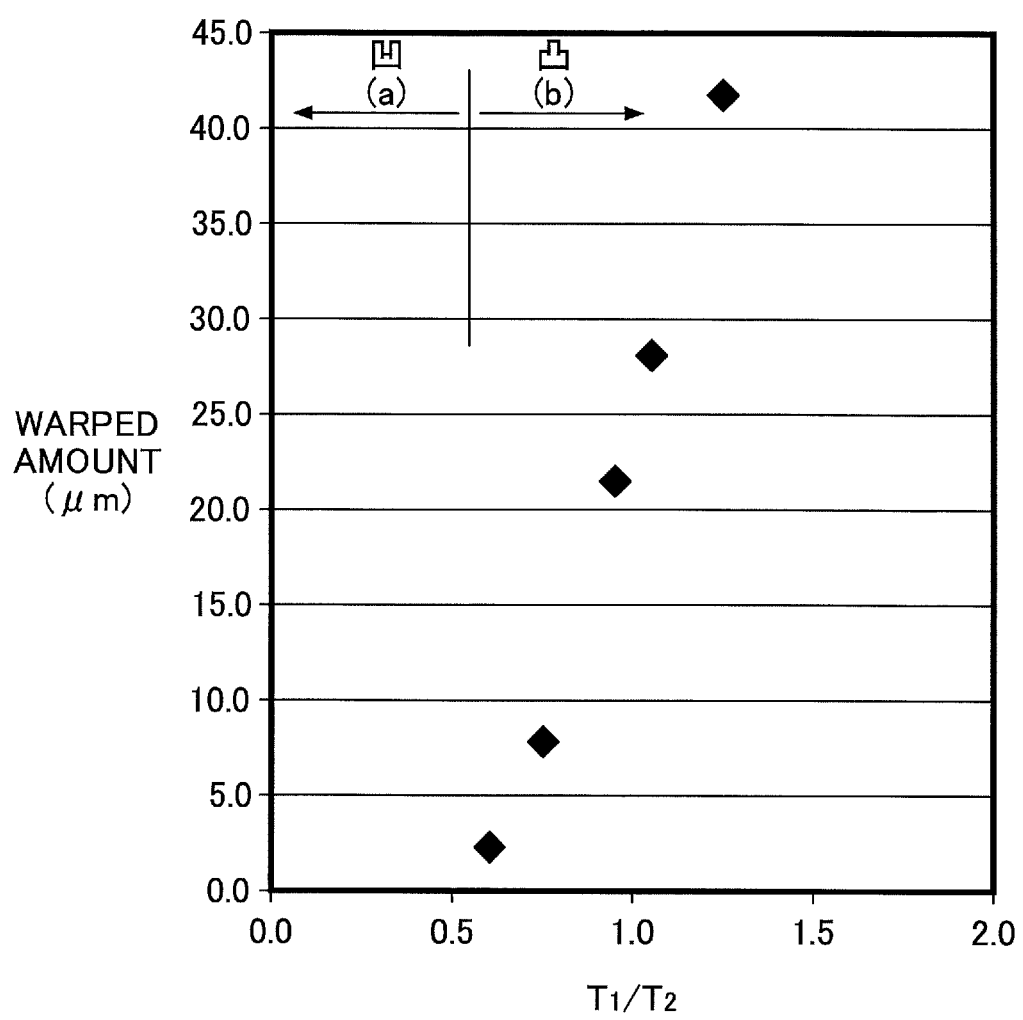
FIG. 20 is a view illustrating a simulation result of example 2.

The simulation result is illustrated in Table 2 and FIG. 20. As illustrated in Table 2 and FIG. 20, it was confirmed that the smaller the ratio $T_1/T_2$ became, in other words, the thinner the thickness $T_1$ of the second wiring component 30 with respect to the thickness $T_2$ of the solder resist layer 40 became, the less the warped amount of the wiring board B became. Further, it was also confirmed that when the ratio $T_1/T_2$ became large, the second wiring component 30 side tended to convex (protrude upwardly) (illustrated as "b"), and when the ratio $T_1/T_2$ became small, the second wiring component 30 side tended to concave (protrude downwardly) (illustrated as "a").

TABLE 2

| $T_1$ (μm) | $T_2$ (μm) | $T_1/T_2$ | WARPED AMOUNT (μm) | WARPING DIRECTION |
|---|---|---|---|---|
| 37.5 | 30.0 | 1.25 | 42.0 | (CONVEX) |
| 31.5 | 30.0 | 1.05 | 28.4 | (CONVEX) |

TABLE 2-continued

| $T_1$ (μm) | $T_2$ (μm) | $T_1/T_2$ | WARPED AMOUNT (μm) | WARPING DIRECTION |
|---|---|---|---|---|
| 28.5 | 30.0 | 0.95 | 21.5 | (CONVEX) |
| 22.5 | 30.0 | 0.75 | 7.9 | (CONVEX) |
| 18.0 | 30.0 | 0.60 | 2.3 | (CONCAVE) |

Comparative Example

A simulation of warp of a wiring board (referred to as a "wiring board C") having a structure in which the solder resist layer 40 is provided instead of the second wiring component 30 illustrated in FIG. 1, in other words, a structure in which the solder resist layers 40 are provided at both sides of the first wiring component 10, was conducted. Specifically, the wiring board C was prepared to have a rectangular shape of 40 mm×40 mm in a plane view. Then, the simulation of warp of the wiring board C was conducted in which the thickness $T_2$ of each of the solder resist layer 40 provided at the both sides of the first wiring component 10 was 30 μm. Here, the thickness of the first wiring component 10 was also fixed in which the thickness of the core layer 11 was 800 μm and the thickness of each of the insulating layers 13, 15, 17, 23, 25 and 27 was 25 μm. The elastic coefficient and the coefficient of thermal expansion of each layer were the same as those of example 1.

The simulation result shows that the warped amount protruding downward was 28 μm.

Summary of Examples 1 and 2, and Comparative Example

The wiring board C of the comparative example had a symmetric structure with respect to the first wiring component 10 in an up and down direction and the warped amount was 28 μm. On the other hand, each of the wiring board A of example 1 and the wiring board B of example 2 had an asymmetry structure in the up and down direction in which the second wiring component 30 that is the high wiring density layer was formed at the first side of the first wiring component 10 and the solder resist layer 40 was formed at the second side of the first wiring component 10.

However, it was confirmed that the warped amount could be more reduced even for the wiring boards A and B having the asymmetry structure in the up and down direction, by setting the ratio ($T_1/T_2$) of the thickness $T_1$ of the second wiring component 30 with respect to the thickness $T_2$ of the solder resist layer 40 to less than or equal to 1, compared with the wiring board C having the symmetric structure in the up and down direction.

Further, according to the study by the present inventors, it is confirmed that it is preferable to suppress the warped amount of the wiring board to less than or equal to 20 μm, and it is more preferable to suppress the warped amount of the wiring board to less than or equal to 10 μm when considering a case in which an electronic component such as a semiconductor chip is mounted on a pad portion of the wiring layer 37 of the second wiring component 30. Thus, according to the above simulation result, the ratio $T_1/T_2$ may be less than or equal to 0.75 in order to suppress the warped amount of the wiring boards A and B to less than or equal to 10 μm.

Example 3

A simulation of warp of the wiring board (referred to as a "wiring board D") having the structure illustrated in FIG. 17 was conducted. Specifically, the wiring board D was prepared to have a rectangular shape of 40 mm×40 mm in a plane view. Then, the simulation of warp of the wiring board D was conducted in which the thickness $T_2$ of the solder resist layer 40 was varied for 10 μm, 15 μm, 20 μm, 30 μm and 40 μm while the thickness $T_1$ of the second wiring component 30D was fixed at 27.5 μm. Here, the thickness of the first wiring component 10D was also fixed in which the thickness of each of the insulating layers 23, 25, and 27 was 25 μm. The elastic coefficient and the coefficient of thermal expansion of each layer were the same as those of example 1.

Figure 21:
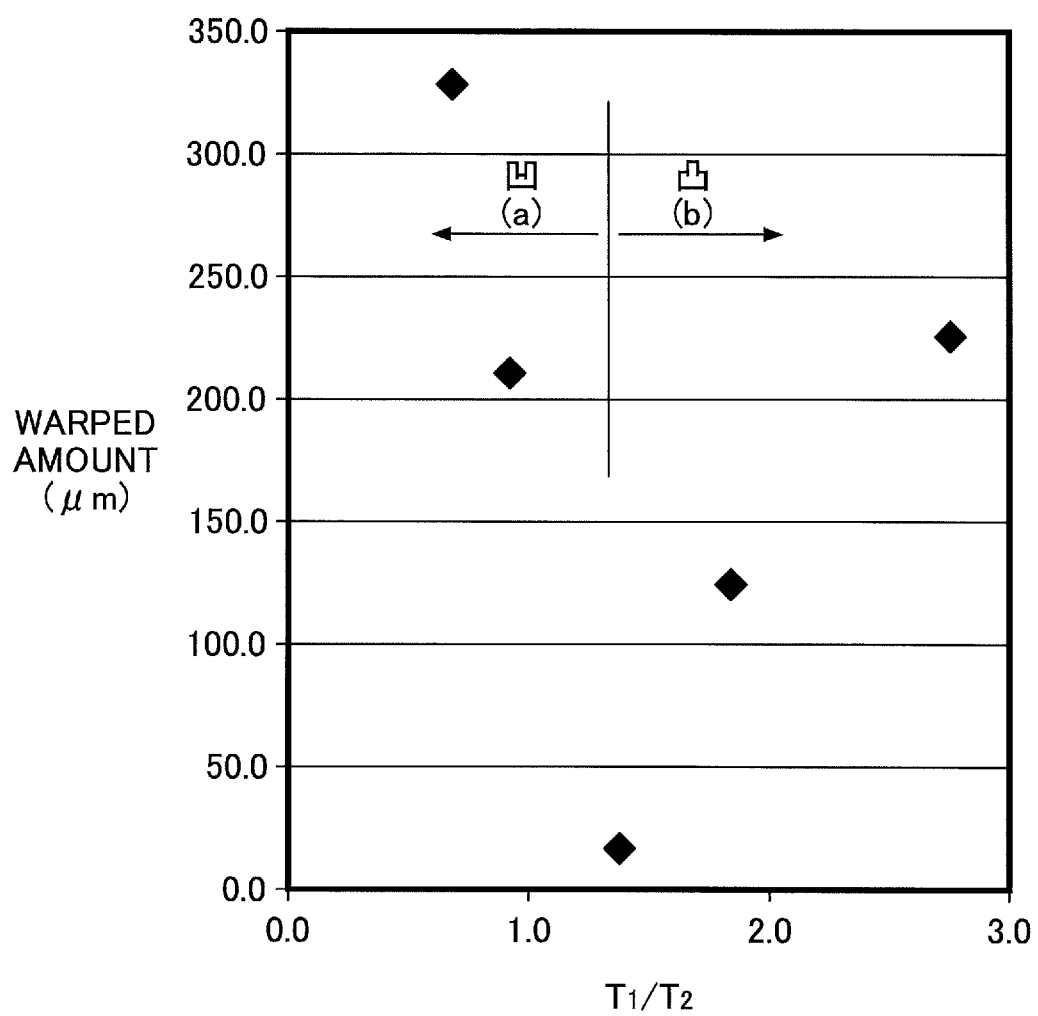
FIG. 21 is a view illustrating a simulation result of example 3.

The simulation result is illustrated in Table 3 and FIG. 21. As illustrated in Table 3 and FIG. 21, it was confirmed that the warped amount of the wiring board D was reduced when the ratio $T_1/T_2$ became close to a predetermined value. Further, when the ratio $T_1/T_2$ was larger than the predetermined value, the second wiring component 30D side tended to convex (protrude upwardly) (illustrated as "b"), and when the ratio $T_1/T_2$ was smaller than the predetermined value, the second wiring component 30D side tended to concave (protrude downwardly) (illustrated as "a").

TABLE 3

| $T_1$ (μm) | $T_2$ (μm) | $T_1/T_2$ | WARPED AMOUNT (μm) | WARPING DIRECTION |
|---|---|---|---|---|
| 27.5 | 10.0 | 2.75 | 226.2 | ↑ (CONVEX) |
| 27.5 | 15.0 | 1.83 | 122.2 | ↑ (CONVEX) |
| 27.5 | 20.0 | 1.38 | 14.4 | ↑ (CONVEX) |
| 27.5 | 30.0 | 0.92 | 211.5 | ↓ (CONCAVE) |
| 27.5 | 40.0 | 0.69 | 329.2 | ↓ (CONCAVE) |

As such, for a coreless structure without the core layer 11 such as the wiring board D, it was confirmed that the tendency of the variation of the warped amount was different from that of the wiring board A or the wiring board B having the core layer 11. In other words, for the wiring board D having the coreless structure, although the warped amount tended to be improved when the ratio $T_1/T_2$ was close to the predetermined value, which was in the vicinity of 1, the warped amount tended to be worse in both cases when the ratio $T_1/T_2$ was larger than or less than the predetermined value.

According to the embodiment, a wiring board or the like capable of suppressing generation of a warp while using a high density wiring layer is provided.

Although a preferred embodiment of the wiring board and the method of manufacturing the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications and modifications may be made without departing from the spirit and scope of the present invention.

Various aspects of the subject-matter described herein are set out non-exhaustively in the following numbered clauses:

1. A method of manufacturing a wiring board, comprising:
    manufacturing a first wiring component that includes an insulating layer including thermosetting resin as a main constituent and a wiring layer;
    stacking a second wiring component that includes an insulating layer including photosensitive resin as a main constituent and a wiring layer, on a first surface of the first wiring component; and
    stacking an outermost insulating layer including photosensitive resin as a main constituent, on a second surface of the first wiring component,
    wherein the manufacturing the first wiring component includes,
        forming the insulating layer including thermosetting resin as a main constituent such that to cover the wiring layer,
        forming a via hole in the insulating layer such that to expose a surface of the wiring layer,
        forming a metal layer on the insulating layer, the metal layer being filled in the via hole and also extending on a surface of the insulating layer, and
        polishing the metal layer to expose the surface of the insulating layer and a surface of the metal layer filled in the via hole,
    wherein the stacking the second wiring component includes,
        forming a wiring layer on the surface of the insulating layer including thermosetting resin as a main constituent, the wiring layer being connected with the surface of the metal layer,
    wherein in the stacking the second wiring component, the wiring density of the second wiring component is made higher than the wiring density of the first wiring component,
    wherein the thickness of the second wiring component with respect to the thickness of the outermost insulating layer is less than or equal to 1, and
    wherein in the polishing the metal layer, the surfaces of the insulating layer and the metal layer filled in the via hole are made to be flush with each other.

2. The method of manufacturing the wiring board according to clause 1,
    wherein in the polishing the metal layer, the surface of the insulating layer is also polished with the metal layer so that roughness of the surface of the insulating layer becomes smaller than roughness of the surface of the insulating layer before being polished.

What is claimed is:

1. A wiring board comprising:
    a core layer;
    a plurality of first insulating layers formed on a first surface of the core layer;
    a plurality of second insulating layers formed on a first surface of an uppermost first insulating layer of the plurality of first insulating layers;
    a third insulating layer formed on a second surface of the core layer, the second surface being opposite to the first surface of the core layer;
    a solder resist layer formed on the third insulating layer,
    a plurality of first wiring layers alternately formed in the plurality of first insulating layers at a first surface side of the core layer;
    a plurality of first via wirings formed by filling metal in via holes in the plurality of first insulating layers, respectively;
    a plurality of second wiring layers alternately formed in the plurality of second insulating layers at the first surface of the uppermost first insulating layer;
    a plurality of second via wirings formed by filling metal in via holes in the plurality of second insulating layers, respectively; and
    a third wiring layer formed at the third insulating layer;
    wherein each of the plurality of first insulating layers, and the third insulating layer are composed of a thermosetting insulating resin, respectively, wherein each of the plurality of second insulating layer, and the solder resist layer are composed of a photosensitive resin, respectively, wherein the plurality of second wiring layers are formed on the first surface of the uppermost first insulating layer and a first end surface of the first via wiring that is embedded in the uppermost first insulating layer and the plurality of second wiring layers are connected to the plurality of first wiring layers through the first via wiring, wherein the first end surface of the first via wiring that is embedded in the uppermost first insulating layer exposes from the first surface of the uppermost first insulating layer to be directly connected with a lowermost second wiring layer, the lowermost second wiring layer being formed on the first surface of the uppermost first insulating layer in the plurality of second wiring layers, wherein the first surface of the uppermost first insulating layer and the first end surface of the first via wiring that is embedded in the uppermost first insulating layer are polished surfaces, wherein the first end surface of the first via wiring that is embedded in the uppermost first insulating layer and the first surface of the uppermost first insulating layer are flush with each other, and wherein the wiring density of the plurality of second wiring layers is higher than the wiring density of the plurality of first wiring layers.

2. The wiring board according to claim 1, wherein the first surface of the uppermost first insulating layer is smoother than a surface of the first insulating layer on which the first wiring layer is formed.

3. The wiring board according to claim 1, wherein the lowermost second wiring layer is a stacked structure of a seed layer and an electrolytic plating layer stacked on the seed layer, and the first end surface of the first via wiring that is embedded in the uppermost first insulating layer is directly connected to the seed layer of the lowermost second wiring layer.

4. The wiring board according to claim 1, wherein a wiring width and a wiring space of each the second wiring layers are smaller than a wiring width and a wiring space of each of the first wiring layers, respectively.

5. The wiring board according to claim 1, wherein a ratio of the thickness of a wiring component composed by the plurality of second insulating layers and the plurality of second wiring layers with respect to the thickness of the solder resist layer is less than or equal to 1.

6. The wiring board according to claim 5, wherein the ratio is less than or equal to 0.75.

7. The wiring board according to claim 1, wherein the coefficient of thermal expansion of each of the first insulating layers and the third insulating layer is larger than the coefficient of thermal expansion of the core layer, and the coefficient of thermal expansion of each of the second insulating layers and the solder resist layer is larger than the coefficient of thermal expansion of each of the first insulating layers and the third insulating layer.

8. The wiring board according to claim 1, wherein roughness of the first surface of the uppermost first insulating layer is Ra 15 to 40 nm, and roughness of a surface of the first insulating layer on which the first wiring layer is formed is Ra 300 to 400 nm.

9. The wiring board according to claim 1, wherein the core layer is provided with a through wiring that penetrates the core layer from the first surface to the second surface, and wherein the plurality of second wiring layers and the third wiring layer are connected through the plurality of first via wirings, the plurality of first wirings and the through wiring.

10. The wiring board according to claim 1, wherein the thickness of each of the first insulating layers is 10 to 20 μm and line/space in each of the first insulating layers is 20 μm/20 μm, while the thickness of each of the second insulating layers is 1 to 3 μm and line/space in each of the second insulating layers is 2 μm/2 μm.

* * * * *